(12) United States Patent
Taguchi et al.

(10) Patent No.: US 7,981,798 B2
(45) Date of Patent: Jul. 19, 2011

(54) METHOD OF MANUFACTURING SUBSTRATE

(75) Inventors: Yuichi Taguchi, Nagano (JP); Akinori Shiraishi, Nagano (JP); Masahiro Sunohara, Nagano (JP); Kei Murayama, Nagano (JP); Hideaki Sakaguchi, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 288 days.

(21) Appl. No.: 12/233,875

(22) Filed: Sep. 19, 2008

(65) Prior Publication Data
US 2009/0081867 A1   Mar. 26, 2009

(30) Foreign Application Priority Data

Sep. 21, 2007  (JP) .................................. 2007-245474

(51) Int. Cl.
*H01L 21/44* (2006.01)
(52) U.S. Cl. ........ 438/675; 438/667; 438/668; 438/669; 438/670; 438/671; 257/E21.249; 257/E33.056; 257/E21.499
(58) Field of Classification Search .......... 438/667–675, 438/733, 6, 26, 33, 83; 257/E21.249, 98, 257/E33.056, E21.499, E21.223, 419, 773, 257/100
See application file for complete search history.

(56) References Cited

U.S. PATENT DOCUMENTS

| | | | | |
|---|---|---|---|---|
| 4,797,715 A * | 1/1989 | Thillays et al. .................. | 257/81 |
| 6,038,928 A * | 3/2000 | Maluf et al. ..................... | 73/724 |
| 6,072,321 A * | 6/2000 | Akram et al. .................... | 29/884 |
| 6,126,276 A * | 10/2000 | Davis et al. ...................... | 347/65 |
| 6,266,874 B1 * | 7/2001 | DiStefano et al. ............... | 29/846 |
| 6,310,484 B1 * | 10/2001 | Akram et al. ................... | 324/754 |
| 6,531,328 B1 * | 3/2003 | Chen ................................ | 438/26 |
| 6,546,623 B2 * | 4/2003 | Caplet et al. .................... | 29/846 |
| 6,908,856 B2 * | 6/2005 | Beyne et al. .................. | 438/667 |
| 7,138,710 B2 * | 11/2006 | Fukazawa ..................... | 257/686 |
| 7,409,762 B2 * | 8/2008 | Kirby .............................. | 29/842 |
| 7,422,978 B2 * | 9/2008 | Lee ................................ | 438/629 |
| 7,518,158 B2 * | 4/2009 | Keller et al. .................... | 257/98 |
| 7,714,341 B2 * | 5/2010 | Chil Keun et al. ............. | 257/98 |
| 7,719,099 B2 * | 5/2010 | Tseng et al. .................. | 257/690 |
| 7,732,233 B2 * | 6/2010 | Lin et al. ......................... | 438/28 |
| 2004/0123664 A1 * | 7/2004 | Ohtoyo et al. ............. | 73/514.33 |

(Continued)

FOREIGN PATENT DOCUMENTS

JP        11-340189        12/1999

(Continued)

*Primary Examiner* — N Drew Richards
*Assistant Examiner* — Ankush k Singal
(74) *Attorney, Agent, or Firm* — Drinker Biddle & Reath LLP

(57) ABSTRACT

The present disclosure relates to a method of manufacturing a substrate. The method includes: (a) forming through holes by applying an anisotropic etching to a silicon substrate from a first surface of the silicon substrate; (b) forming a first insulating film to cover the first surface of the silicon substrate, surfaces of the silicon substrate exposed from the through holes, and a second surface of the silicon substrate opposite to the first surface; (c) forming an opening in a portion of the first insulating film provided on the second surface, the portion of the first insulating film corresponding to an area in which the through holes are formed; (d) etching the silicon substrate using the first insulating film provided on the second surface as a mask, thereby forming a cavity in the silicon substrate; and (e) removing the first insulating film.

5 Claims, 25 Drawing Sheets

U.S. PATENT DOCUMENTS

| | | | |
|---|---|---|---|
| 2004/0173909 A1* | 9/2004 | Sinha et al. | 257/762 |
| 2005/0029535 A1* | 2/2005 | Mazzochette et al. | 257/100 |
| 2005/0029630 A1* | 2/2005 | Matsuo | 257/628 |
| 2005/0215054 A1* | 9/2005 | Rasmussen et al. | 438/667 |
| 2005/0226062 A1* | 10/2005 | Aratani et al. | 365/199 |
| 2006/0057761 A1* | 3/2006 | Mi et al. | 438/57 |
| 2006/0096948 A1* | 5/2006 | Yagi et al. | 216/17 |
| 2006/0139729 A1 | 6/2006 | Roux | |
| 2006/0208271 A1* | 9/2006 | Kim et al. | 257/100 |
| 2006/0264055 A1* | 11/2006 | Leith et al. | 438/733 |
| 2007/0001312 A1* | 1/2007 | Murayama et al. | 257/773 |
| 2007/0090510 A1 | 4/2007 | Tseng | |
| 2007/0238328 A1* | 10/2007 | Ferstl | 439/83 |
| 2007/0246724 A1* | 10/2007 | Wen et al. | 257/98 |
| 2009/0026472 A1* | 1/2009 | Yasuda et al. | 257/98 |

FOREIGN PATENT DOCUMENTS

| | | |
|---|---|---|
| JP | 2007-201361 | 8/2007 |

\* cited by examiner

METHOD OF MANUFACTURING SUBSTRATE

This application is based on and claims priority from Japanese Patent Application No. 2007-245474, filed on Sep. 21, 2007, the entire contents of which are incorporated by reference herein.

BACKGROUND OF THE INVENTION

1. Technical Field

The present disclosure relates to a method of manufacturing a silicon substrate in which a cavity and through holes connected to the cavity are formed. More particularly, the present disclosure relates to a method of manufacturing a substrate capable of forming through holes in good profile and capable of preventing such a situation that side surfaces of the cavity are roughened by an etching process in forming the through holes.

2. Related Art

As a silicon substrate in which the cavity and the through holes connected to the cavity are formed, for example, there are known a wiring substrate applied to the light emitting device (see FIG. 1), a conductive ball sucking (mounting) substrate (see FIG. 2), and the like.

FIG. 1 is a sectional view of a light emitting device having a wiring substrate in the related art.

By reference to FIG. 1, a light emitting device 200 in the related art includes a wiring substrate 201, a light emitting element 202, and a glass substrate 203. The wiring substrate 201 has a silicon substrate 205, an insulating film 206, through silicon vias 208, and wirings 209.

The silicon substrate 205 is constructed such that a cavity 212 and through holes 213 are formed. The cavity 212 is formed on an upper surface 205A (a surface of the silicon substrate 205 on the side on which the glass substrate 203 is provided) side of the silicon substrate 205. The cavity 212 is a concave portion (housing portion) for housing the light emitting element 202 therein. The cavity 212 has a sectional shape whose width is widened gradually toward the upper side from a bottom surface 212A of the cavity 212. A side surface 212B of the cavity 212 is shaped as an inclined surface having a predetermined angle. The side surface 212B of the cavity 212 functions as a reflector for reflecting a light that the light emitting element 202 emits.

The through holes 213 are formed to pass through the portion, which is arranged beneath the cavity 212, of the silicon substrate 205. The insulating film 206 is provided to cover the upper surface 205A and a lower surface 205B of the silicon substrate 205, the bottom surface 212A and the side surface 212B of the cavity 212, and surfaces of portions, which correspond to the side surfaces of the through holes 213, of the silicon substrate 205.

The through silicon via 208 is provided in the through holes 213, on which the insulating film 206 is formed, respectively. Upper ends of the through silicon vias 208 are connected to the light emitting element 202, and lower ends thereof are connected to the wirings 209.

The wirings 209 are provided on the insulating film 206 arranged on the lower surface 205B of the silicon substrate 205 such that these wirings are connected to lower ends of the through silicon vias 208. The wirings 209 are connected to a mounting substrate (not shown) such as a motherboard, or the like.

The light emitting element 202 is housed in the cavity 212 and is connected to the through silicon vias 208. Accordingly, the light emitting element 202 is connected electrically to the wirings 209 via the through silicon vias 208. The glass substrate 203 is provided on the portion, which is formed on the upper surface 205A of the silicon substrate 205, of the insulating film 206 to airtightly seal the cavity 212 in which the light emitting element 202 is housed.

FIG. 2 is a sectional view of the conductive ball sucking (mounting) substrate in the related art. In FIG. 2, such a state is schematically shown that conductive balls 231 are sucked by the conductive ball sucking substrate 230.

By reference to FIG. 2, the conductive ball sucking substrate 230 in the related art is constructed such that cavities 236 and through holes 237 are formed in a silicon substrate 235.

The cavities 236 are formed on the lower surface 235B side of the silicon substrate 235. The cavity 236 is a concave portion (housing portion) for restricting a position of the conductive ball 231 when the conductive ball 231 is sucked. The cavities 236 are connected to the through holes 237 respectively. The cavity 236 has a sectional shape whose width is widened gradually as a distance from the through hole 237 is increased. A side surface 236B of the cavity 236 is formed as an inclined surface having a predetermined angle. The side surface 236B of the cavity 236 contacts the conductive ball 231 when the conductive ball 231 is sucked.

The through holes 237 are formed to pass through the portions, which are arranged over the cavities 236, of the silicon substrate 235 respectively. The through holes 237 are connected to an exhaust equipment (not shown). When an air in the cavities 236 is exhausted by the exhaust equipment via the through holes 237, the cavities 236 allow the conductive ball 231 to be sucked respectively.

The conductive ball sucking substrate 230 constructed as above is the substrate for mounting the conductive balls 231 on the pads (pads coated with adhesive) of the wiring substrate (not shown). In this case, the cavities 236 and the through holes 237 provided in the conductive ball sucking substrate 230 can be formed by the similar approach to that applied to the cavities 212 and the through holes 213 provided in the wiring substrate 200.

FIGS. 3 to 11 are views showing steps of manufacturing a wiring substrate in the related art. In FIG. 3 to FIG. 11, the same reference symbols are affixed to the same constituent portions as those of the wiring substrate 200 shown in FIG. 1 in the related art.

Then, a method of manufacturing the wiring substrate 201 will be described with reference to FIG. 3 to FIG. 1 hereunder. At first, in steps shown in FIG. 3, the silicon substrate 205 (the silicon substrate 205 in a state before the cavities 212 and the through holes 213 are formed) is prepared. The silicon substrate 205 is the silicon substrate whose surface 205A is formed as a <100> face.

Then, in steps shown in FIG. 4, an insulating film 241 is formed on both surfaces 205A, 205B of the silicon substrate 205. Then, a resist film 243 having an opening 243A on the insulating film 241 formed on the surface 205A of the silicon substrate 205 is formed. The opening 243A is formed to expose the portion of the insulating film 241 corresponding to a forming area of the cavity 212.

Then, in steps shown in FIG. 5, the insulating film 241 exposed from the opening 243A is removed by the etching using the resist film 243 as a mask, and thus an opening 241A is formed in the insulating film 241. The opening 241A is formed to expose the surface 205A of the silicon substrate 205. Then, in steps shown in FIG. 6, the resist film 243 shown in FIG. 5 is removed.

Then, in steps shown in FIG. 7, the silicon substrate 205 is etched by the wet etching using the insulating film 241 having the opening 241A as a mask. Thus, the cavity 212 whose side surface 212B is shaped into an inclined surface is formed.

Then, in steps shown in FIG. 8, the insulating film 241 formed on both surfaces 205A, 205B of the silicon substrate 205 is removed. Then, in steps shown in FIG. 9, a resist film 245 having openings 245A is formed on the surface 205B (surface of the silicon substrate 205 opposite to the side on which the cavity 212 is formed) of the silicon substrate 205. At this time, the openings 245A are formed to expose the portions, which correspond to the forming areas of the through holes 213, of the surface 205B of the silicon substrate 205.

Then, in steps shown in FIG. 10, the through holes 213 are formed by etching the silicon substrate 205 from the surface 205B side of the silicon substrate 205 by the anisotropic etching method while using the resist film 245 as a mask (through hole forming step).

Then, in steps shown in FIG. 11, the insulating film 206 is formed by the well-known approach to cover the portions of the surfaces of the silicon substrate 205 corresponding to the bottom surface 212A and the side surface 212B of the cavity 212, the portions of the surfaces of the silicon substrate 205 corresponding to the side surfaces of the through holes 213, and both surfaces 205A, 205B of the silicon substrate 205. As a result, the wiring substrate 201 is manufactured (see e.g., JP-A-2007-201361).

FIG. 12 is a sectional view to describe the problems in the method of manufacturing the wiring substrate in the related art. In FIG. 12, the same reference symbols are affixed to the same constituent portions as those of the structure described previously and shown in FIG. 10.

However, as shown in FIG. 12, in the method of manufacturing the wiring substrate 201 in the related art, the cavity 212 is formed by applying the wet etching to the silicon substrate 205 from the surface 205A side of the silicon substrate 205. Then, the portions of the silicon substrate 205, which are arranged beneath the cavity 212, are etched by applying the anisotropic etching from the surface 205B side of the silicon substrate 205. Thus, the through holes 213 are formed.

For this reason, such problems existed that a notch E is generated at the edge portions of the through holes 213 located near the bottom surface 212A of the cavity 212 and also the side surfaces 212B of the cavity 212 are roughened by the anisotropic etching in forming the through holes 213. For example, when the notch is generated on the through holes 213, reliability of the electrical connection between the through silicon vias 208 and the light emitting element 202 is lowered. Also, when the side surfaces 212B of the cavity 212 are roughened, such side surfaces 212B of the cavity 212 do not function as the reflector that reflects a light that the light emitting element 202 emits.

For example, when the notch is generated on the silicon substrate 235 provided to the conductive ball sucking substrate 230 or when the side surfaces of the cavities 236 are roughened, a breakage of the conductive ball sucking substrate 230 or a defective suction of the conductive balls 231 might be caused.

SUMMARY

Exemplary embodiments of the present invention address the above disadvantages and other disadvantages not described above. However, the present invention is not required to overcome the disadvantages described above, and thus, an exemplary embodiment of the present invention may not overcome any of the problems described above.

It is an aspect of the present invention to provide a method of manufacturing a substrate capable of forming through holes shaped in good profile, and capable of preventing such a situation that side surfaces of a cavity are roughened.

According to one or more aspects of the present invention, there is provided a method of manufacturing a substrate. The method includes the successive steps of:

(a) forming through holes by applying an anisotropic etching to a silicon substrate from a first surface of the silicon substrate;

(b) forming a first insulating film to cover the first surface of the silicon substrate, surfaces of the silicon substrate exposed from the through holes, and a second surface of the silicon substrate opposite to the first surface;

(c) forming an opening in a portion of the first insulating film provided on the second surface, the portion of the first insulating film corresponding to an area in which the through holes are formed;

(d) etching the silicon substrate using the first insulating film provided on the second surface as a mask such that at least the first insulating film provided on bottom surfaces of the through holes is exposed, thereby forming a cavity in the silicon substrate; and (e) removing the first insulating film.

According to one or more aspects of the present invention, there is provided a method of manufacturing a light emitting device. The method includes the successive steps of:

(a) forming through holes by applying an anisotropic etching to a silicon substrate from a first surface of the silicon substrate;

(b) forming a first insulating film to cover the first surface of the silicon substrate, surfaces of the silicon substrate exposed from the through holes, and a second surface of the silicon substrate opposite to the first surface;

(c) forming an opening in a portion of the first insulating film provided on the second surface, the portion of the first insulating film corresponding to an area in which the through holes are formed;

(d) etching the silicon substrate using the first insulating film provided on the second surface as a mask such that at least the first insulating film provided on bottom surfaces of the through holes is exposed, thereby forming a cavity in the silicon substrate;

(e) removing the first insulating film;

(f) forming a second insulating film to cover at least the second surface of the silicon substrate and surfaces of the silicon substrate corresponding to side surfaces of the through holes;

(g) forming a through silicon via in the through holes on which the second insulating film is formed;

(h) forming wirings connected to one end portions of the through holes, on the first surface of the silicon substrate;

(i) housing a light emitting element in the cavity such that the light emitting element is electrically connected to the other portions of the through holes; and (j) disposing a glass substrate on an upper end portion of the cavity to cover the cavity.

According to one or more aspects of the present invention, there is provided a method of manufacturing a conductive ball mounting substrate. The method includes the successive steps of:

(a) forming a plurality of through holes by applying an anisotropic etching to a silicon substrate from a first surface of the silicon substrate;

(b) forming a first insulating film to cover the first surface of the silicon substrate, surfaces of the silicon substrate exposed from the through holes, and a second surface of the silicon substrate opposite to the first surface;

(c) forming a plurality of openings in portions of the first insulating film provided on the second surface, the portions of the first insulating film corresponding to areas in which the through holes are formed;

(d) etching the silicon substrate using the first insulating film provided on the second surface as a mask such that at least the first insulating film provided on bottom surfaces of the through holes is exposed, thereby forming a plurality of cavities in the silicon substrate; and (e) removing the first insulating film.

According to the present invention, the through holes are formed by applying the anisotropic etching to the silicon substrate from the first surface side of the silicon substrate prior to the formation of the cavity. Therefore, the side surfaces of the cavity are never etched by the anisotropic etching applied in forming the through holes. As a result, such a situation can be prevented that the side surfaces of the cavity are roughened.

Also, the first insulating film is formed to cover the first surface of the silicon substrate, the surfaces of the portions, which are exposed from the through holes, of the silicon substrate, and the second surface of the silicon substrate positioned on the opposite side to the first surface after the through hole forming step. Then, the cavity is formed by etching the silicon substrate while using the first insulating film, which is provided on the second surface of the silicon substrate and has the openings, as a mask such that at least the portions of the first insulating film provided on the bottom surfaces of the through holes are exposed. Therefore, the portions of the first insulating film, which are formed on the bottom surfaces and the side surfaces of the through holes, function as an etching stopper. As a result, the portions of the silicon substrate corresponding to the side surfaces of the through holes are never etched in the cavity forming step, and thus the through holes shaped in good profile can be formed.

Other aspects and advantages of the present invention will be apparent from the following description, the drawings, and the claims.

BRIEF DESCRIPTION OF THE DRAWINGS

The above and other aspects, features and advantages of the present invention will be more apparent from the following more particular description thereof, presented in conjunction with the following drawings wherein.

DETAILED DESCRIPTION OF EXEMPLARY EMBODIMENTS OF THE PRESENT INVENTION

Exemplary embodiments of the present invention will be described with reference to the drawings hereinafter.

First Embodiment

Figure 1:
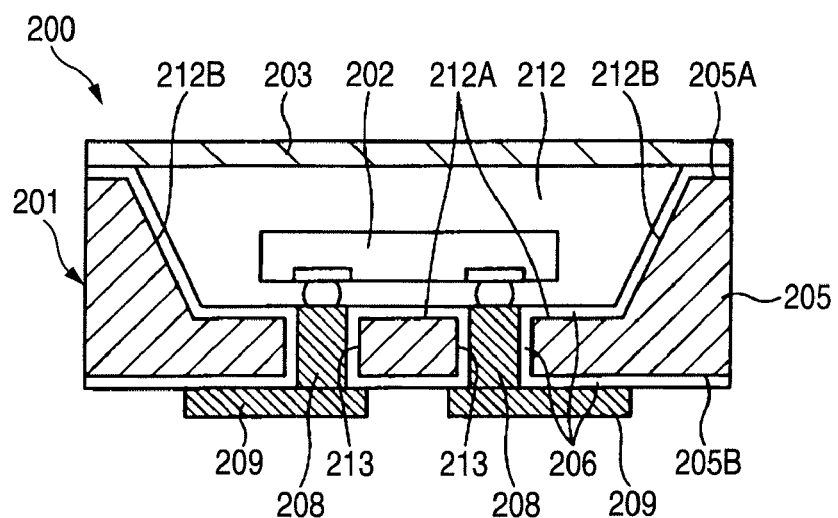
FIG. 1 is a sectional view of a light emitting device having a wiring substrate in the related art.
Figure 2:
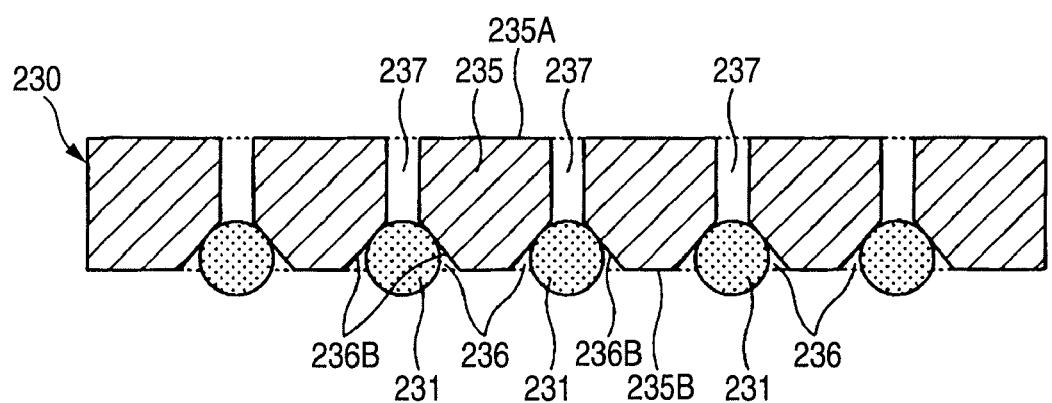
FIG. 2 is a sectional view of a conductive ball chucking substrate in the related art.
Figure 3:
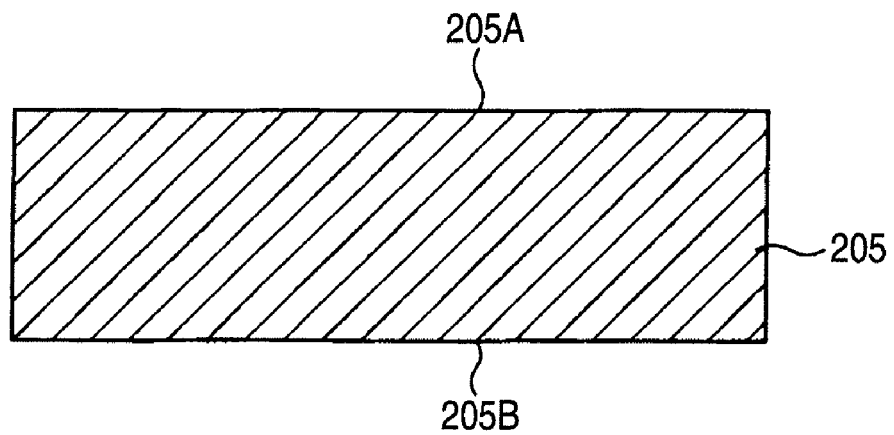
FIG. 3 is a view (#1) showing steps of manufacturing a wiring substrate in the related art.
Figure 4:
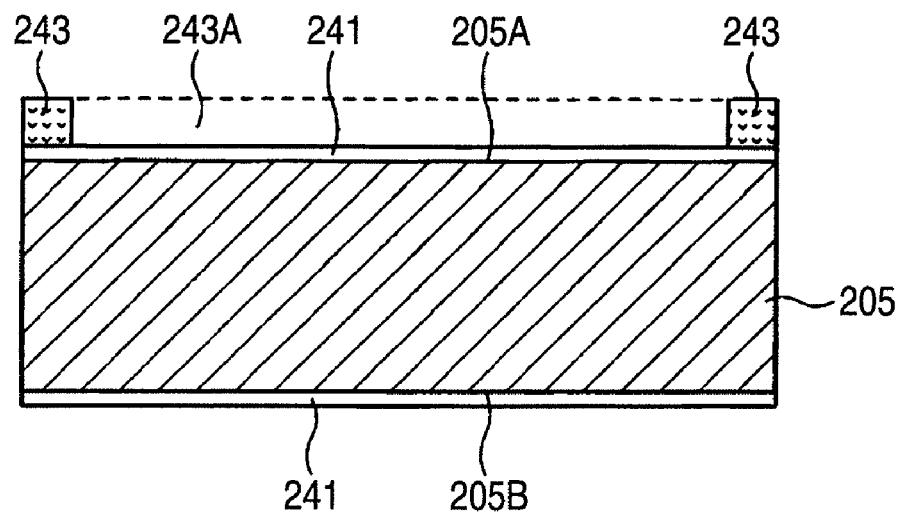
FIG. 4 is a view (#2) showing steps of manufacturing the wiring substrate in the related art.
Figure 5:
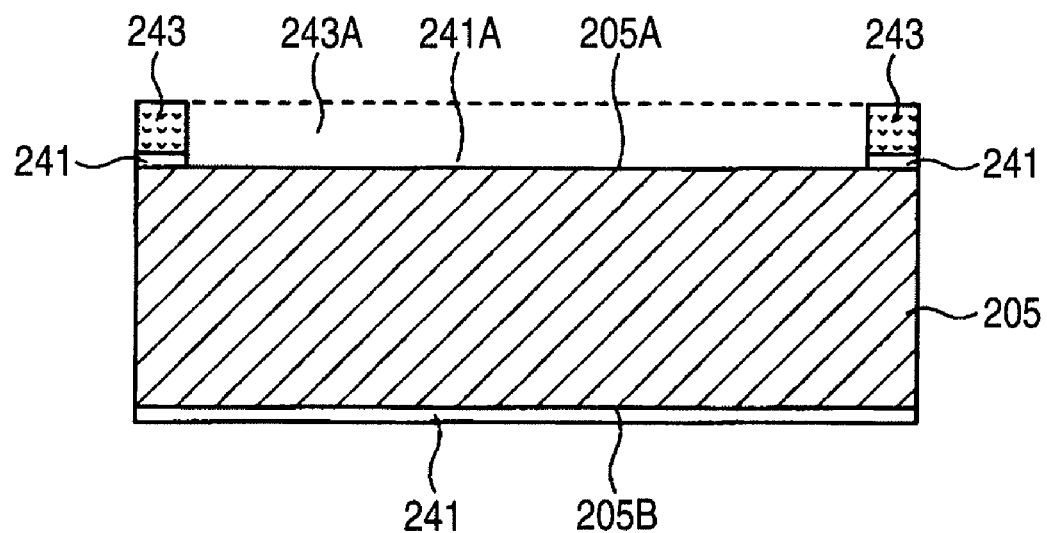
FIG. 5 is a view (#3) showing steps of manufacturing the wiring substrate in the related art.
Figure 6:
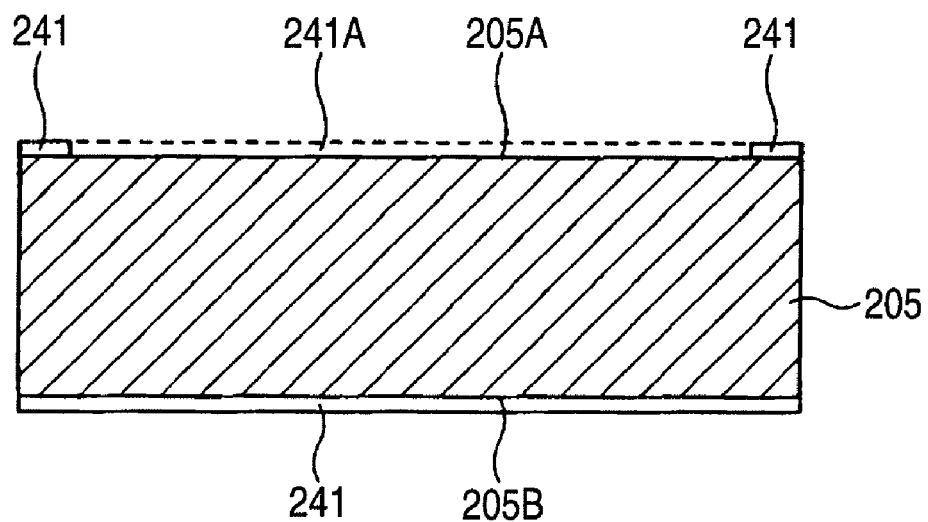
FIG. 6 is a view (#4) showing steps of manufacturing the wiring substrate in the related art.
Figure 7:
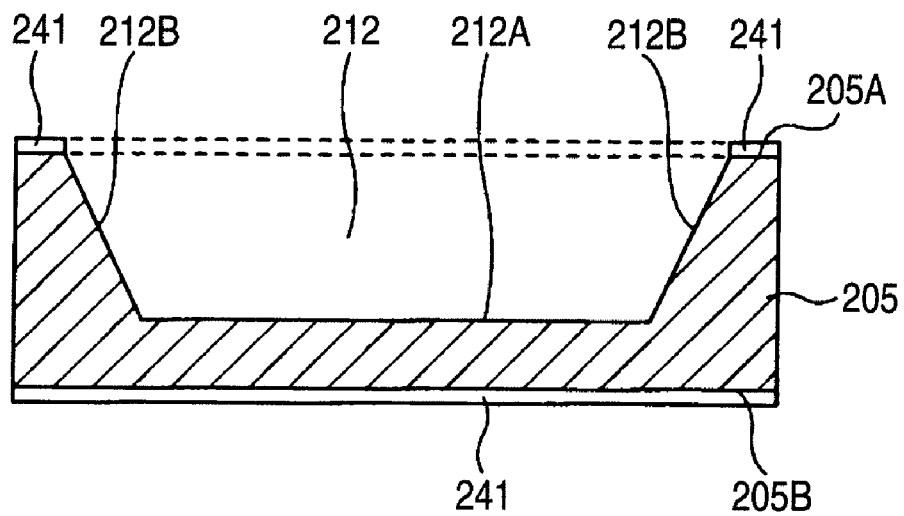
FIG. 7 is a view (#5) showing steps of manufacturing the wiring substrate in the related art.
Figure 8:
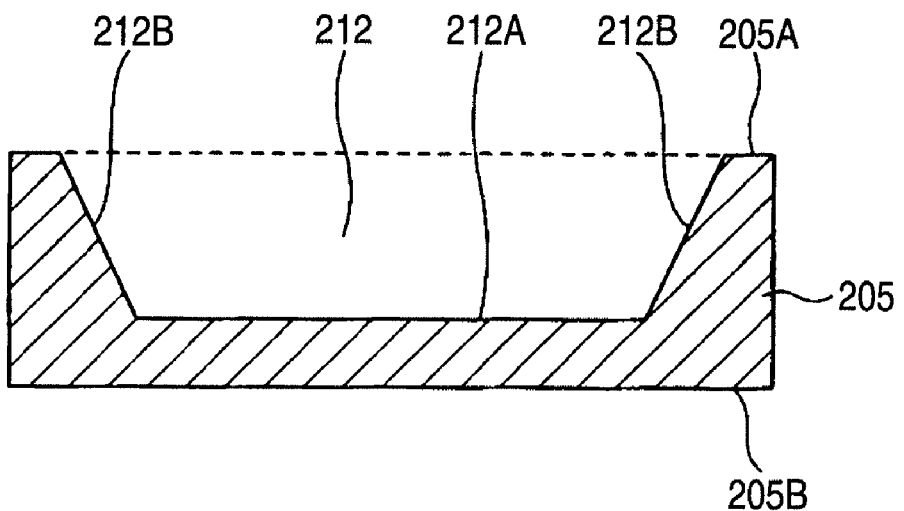
FIG. 8 is a view (#6) showing steps of manufacturing the wiring substrate in the related art.
Figure 9:
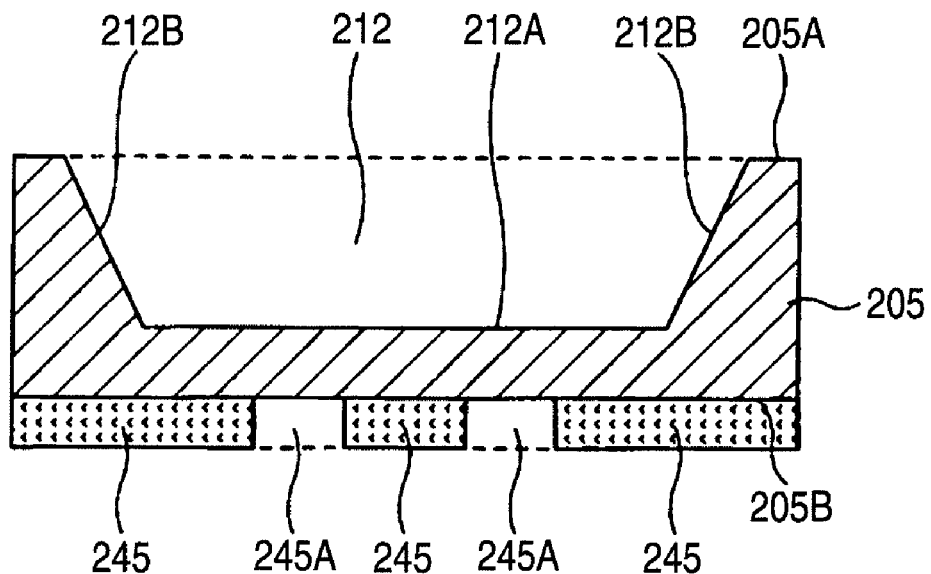
FIG. 9 is a view (#7) showing steps of manufacturing the wiring substrate in the related art.
Figure 10:
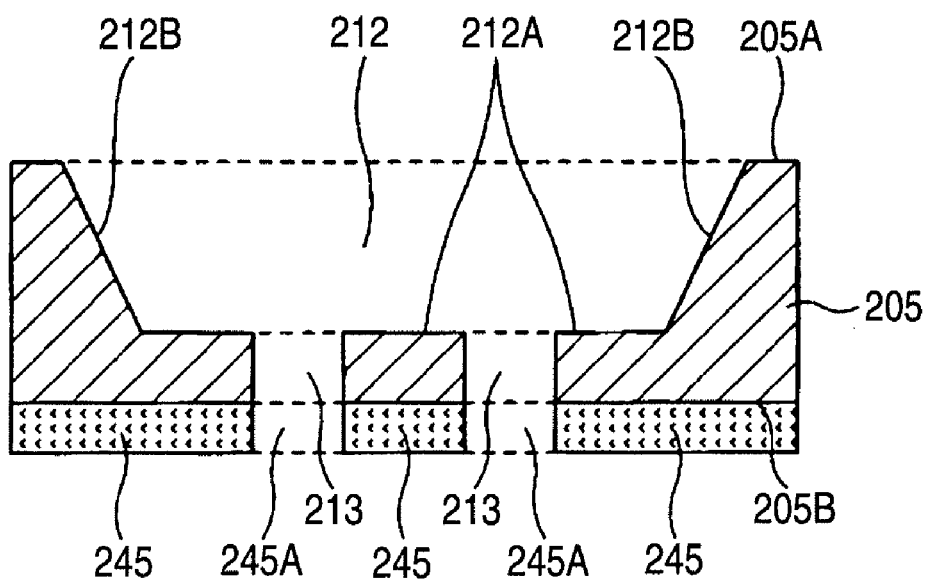
FIG. 10 is a view (#8) showing steps of manufacturing the wiring substrate in the related art.
Figure 11:
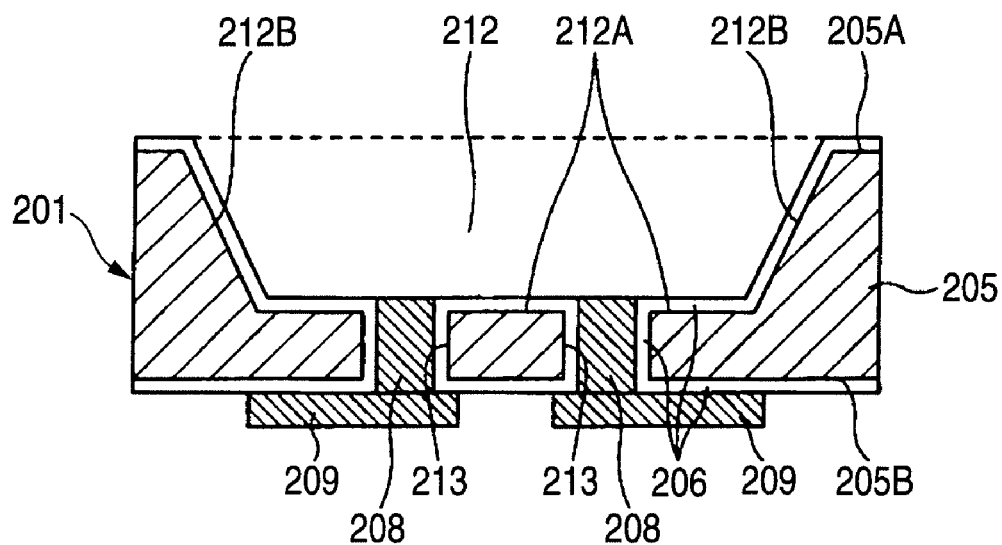
FIG. 11 is a view (#9) showing steps of manufacturing the wiring substrate in the related art.
Figure 12:
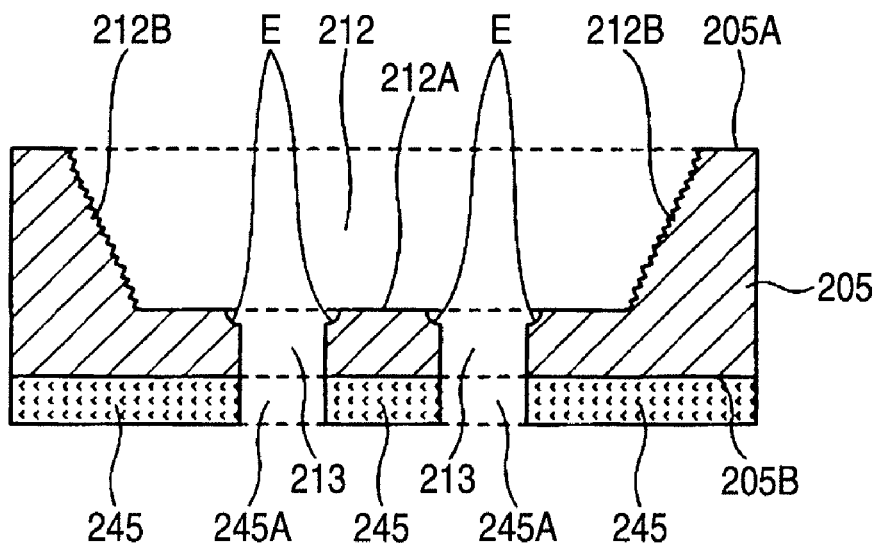
FIG. 12 is a sectional view to describe the problems in the method of manufacturing the wiring substrate in the related art.
Figure 13:
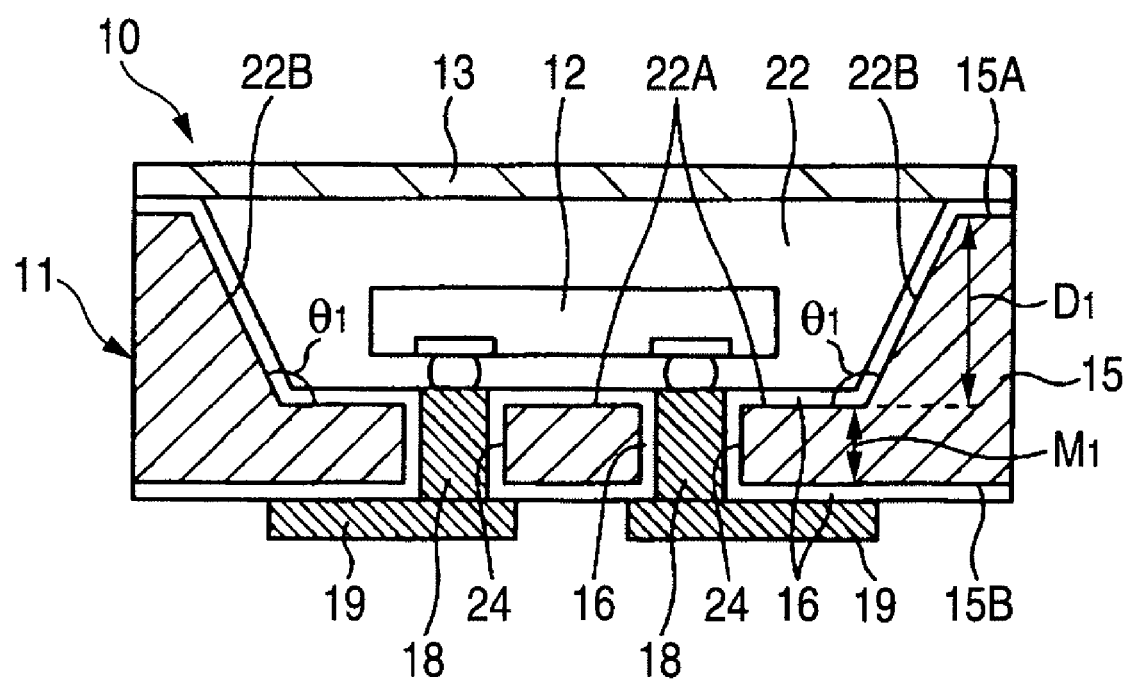
FIG. 13 is a sectional view of a light emitting device having a substrate according to a first embodiment of the present invention.

FIG. 13 is a sectional view of a light emitting device having a substrate according to a first embodiment of the present invention. In the present embodiment, following explanation will be made by taking a substrate 11 applicable to a light emitting device 10 as an example.

By reference to FIG. 13, the light emitting device 10 includes the substrate 11, a light emitting element 12, and a glass substrate 13. The substrate 11 has a silicon substrate 15, an insulating film 16 as a second insulating film, through silicon vias 18, and wirings 19.

The silicon substrate 15 is constructed such that a cavity 22 and through holes 24 are formed on this silicon substrate. The cavity 22 is formed on a surface 15A side of the silicon substrate 15 (the surface side of the silicon substrate 15 on which the glass substrate 13 is provided). The cavity 22 is a concave portion (housing portion) for housing the light emitting element 12 therein. The cavity 22 has a sectional shape whose width is widened gradually toward the upper end of the cavity 22 (the surface 15A side of the silicon substrate 15) from a bottom surface 22A. A side surface 22B of the cavity 22 functions as a reflector for reflecting a light that the light emitting element 12 emits in the predetermined direction. An angle $\theta_1$ between the side surface 22B of the cavity 22 and the bottom surface 22A of the cavity 22 can be set in a range of 125 degree to 135 degree, for example. Also, a depth $D_1$ of the cavity 22 can be set to 200 μm to 500 μm, for example. The cavity 22 can be formed by applying the wet etching to the silicon substrate 15, for example.

The through holes 24 are formed to pass through the portion of the silicon substrate 15, which correspond to the bottom surface 22A of the cavity 22 (in other words, the portion of the silicon substrate 15 between the bottom surface 22A of the cavity 22 and a surface 15B of the silicon substrate 15). A thickness $M_1$ of the portions, in which the through holes 24 are formed, of the silicon substrate 15 can be set to 200 μm, for example. The through holes 24 are formed by applying the anisotropic etching, for example (the dry etching, for example) to the silicon substrate 15.

The insulating film 16 is provided to cover the surface 15A and the surface 15B of the silicon substrate 15, the bottom surface 22A and the side surfaces 22B of the cavity 22, and surfaces of the portions of the silicon substrate 15 corresponding to the side surfaces of the through holes 24. The insulating film 16 is provided to insulate the silicon substrate 15 from the through silicon vias 18 and the wirings 19. As the insulating film 16, for example, oxide film, thermal oxide film, or nitride film (e.g., SiN film) can be used. When the oxide film or the thermal oxide film is used as the insulating film 16, a thickness of the insulating film 16 can be set to 0.5 μm to 1.5 μm, for example.

The through silicon via 18 is provided in the through holes 24, on which the insulating film 16 is formed, respectively. Upper end surfaces of the through silicon vias 18 are substantially in the same plane as the upper surface of the insulating film 16 provided on the bottom surface 22A of the cavity 22. Also, lower end surfaces of the through silicon vias 18 are in the same plane as the lower surface of the insulating film 16 provided on the surface 15B of the silicon substrate 15. The upper ends of the through silicon vias 18 are connected to the light emitting element 12, and the lower ends of the through silicon vias 18 are connected to the wirings 19. Accordingly, the through silicon vias 18 connect electrically the light emitting element 12 and the wirings 19. As the material of the through silicon vias 18, for example, Cu can be used.

The wirings 19 are the re-wiring, and are provided on the lower ends of the through silicon vias 18 and on the lower surface of the insulating film 16 formed on the surface 15B of the silicon substrate 15. As the material of the wirings 19, for example, Cu can be used.

The light emitting element 12 is connected to the upper ends of the through silicon vias 18. The light emitting element 12 is housed in the cavity 22. As the light emitting element 12, for example, a light emitting diode (LED) can be used.

The glass substrate 13 is provided on the top end of the substrate 11 to cover the upper end portion of the cavity 22 in which the light emitting element 12 is housed. The glass substrate 13 is the member that is used to airtightly seal the cavity 22 in which the light emitting element 12 is housed.

FIGS. 14 to 27 are views showing steps of manufacturing the substrate according to the first embodiment of the present invention. In FIG. 14 to FIG. 27, "B" denotes a cutting position along which the silicon substrate 15 is cut (referred to as a "cutting position B" hereinafter). Also, in FIG. 14 to FIG. 27, the same reference symbols are affixed to the same constituent portions as those of the substrate 11 in the first embodiment.

Figure 14:
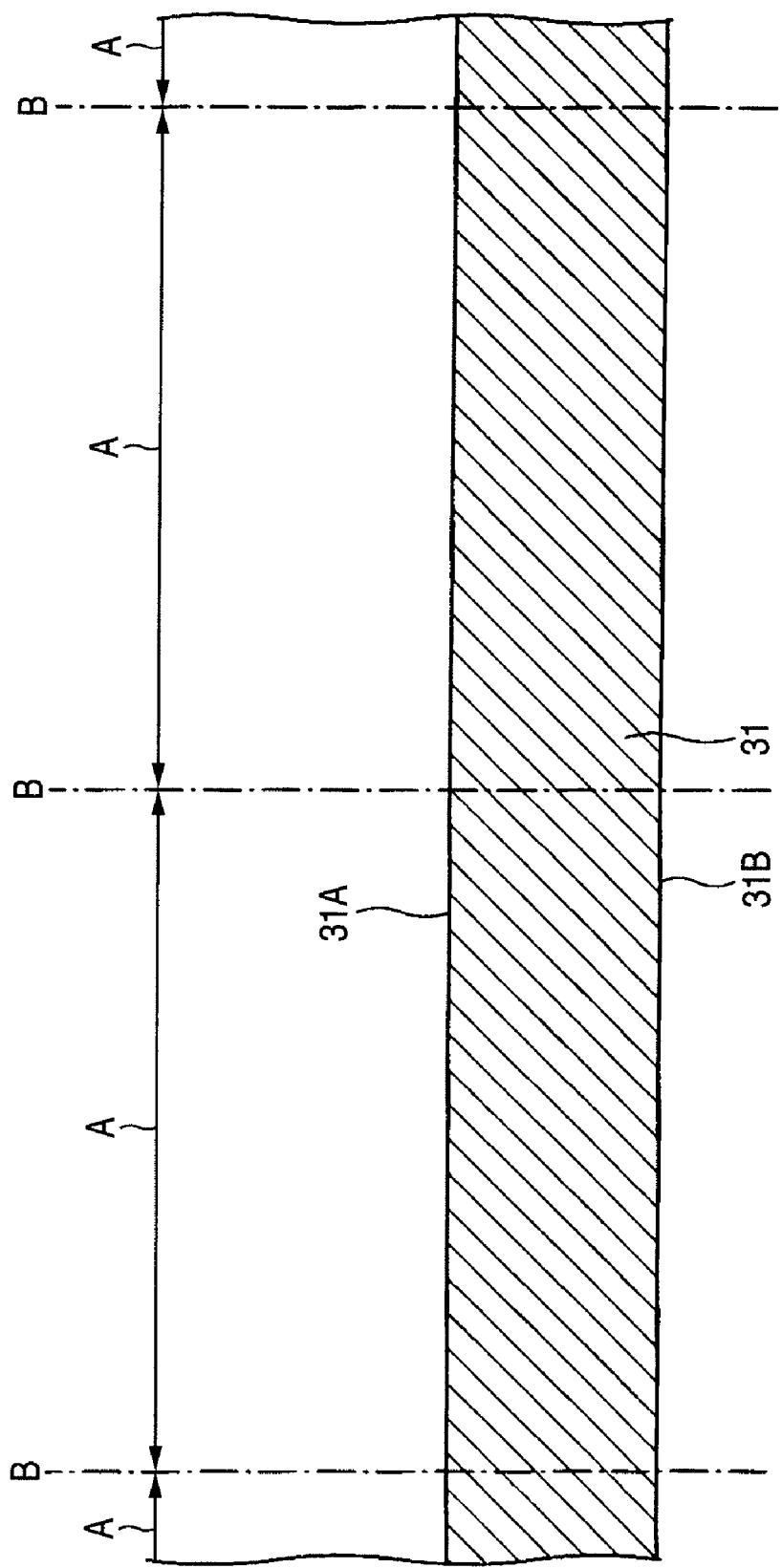
FIG. 14 is a view (#1) showing steps of manufacturing the substrate according to the first embodiment of the present invention.

At first, in steps shown in FIG. 14, a silicon substrate 31 is prepared. A plurality of substrate forming areas A in which the substrate 11 is formed respectively are provided to the silicon substrate 31, and a surface 31A of the silicon substrate 31 on which the cavity 22 is formed is set as a <100> face. The silicon substrate 31 is a base material of the silicon substrate 15 described previously and shown in FIG. 13. As the silicon substrate 31, for example, a silicon wafer can be used. A thickness of the silicon substrate 31 can be set to 400 μm, for example.

Figure 15:
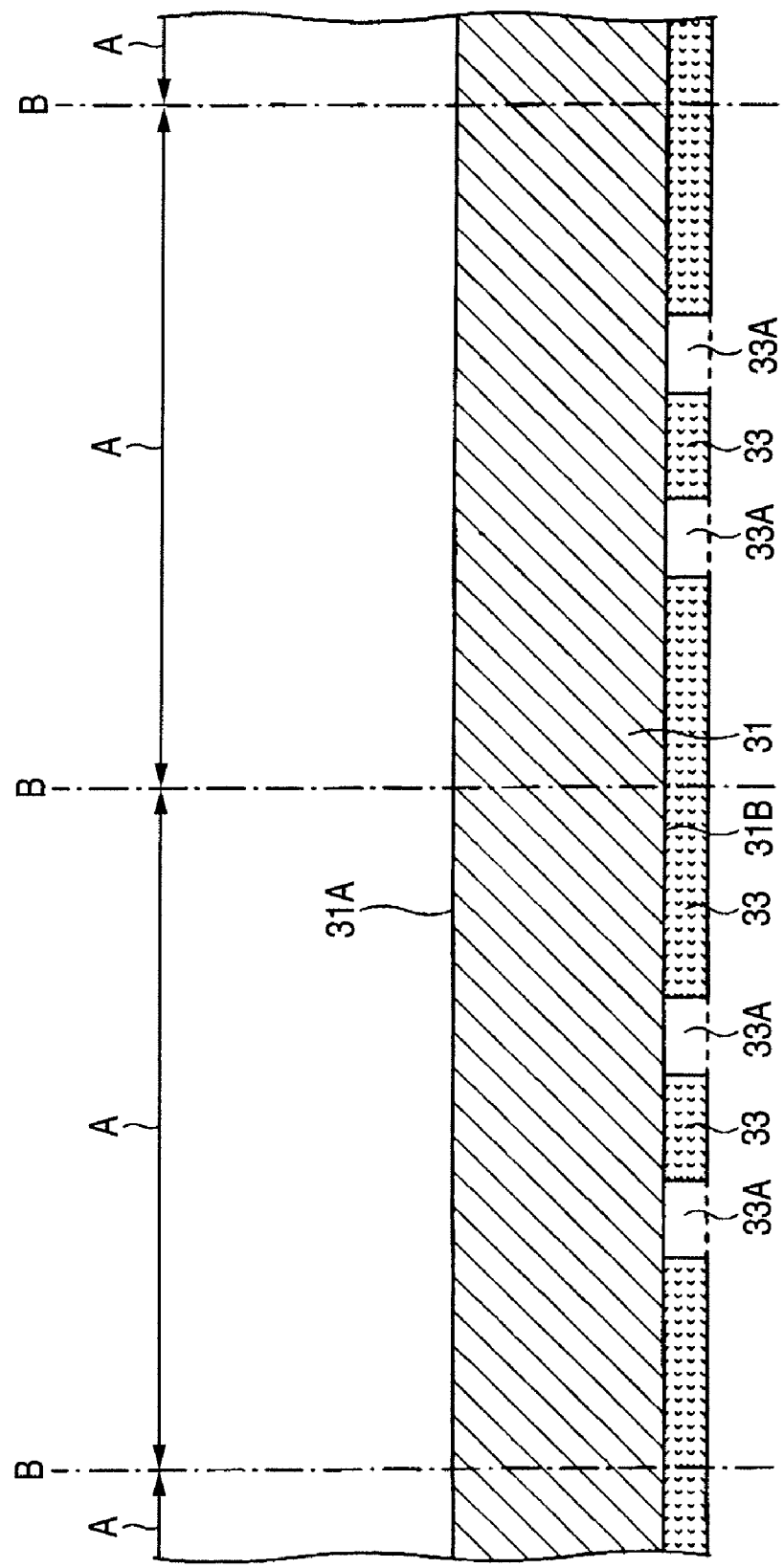
FIG. 15 is a view (#2) showing steps of manufacturing the substrate according to the first embodiment of the present invention.

Then, in steps shown in FIG. 15, a resist film 33 having openings 33A is formed on a surface 31B of the silicon substrate 31. At this time, the openings 33A are formed to expose the portions, which correspond to forming areas of the through holes 24, of the surface 31B of the silicon substrate 31.

Figure 16:
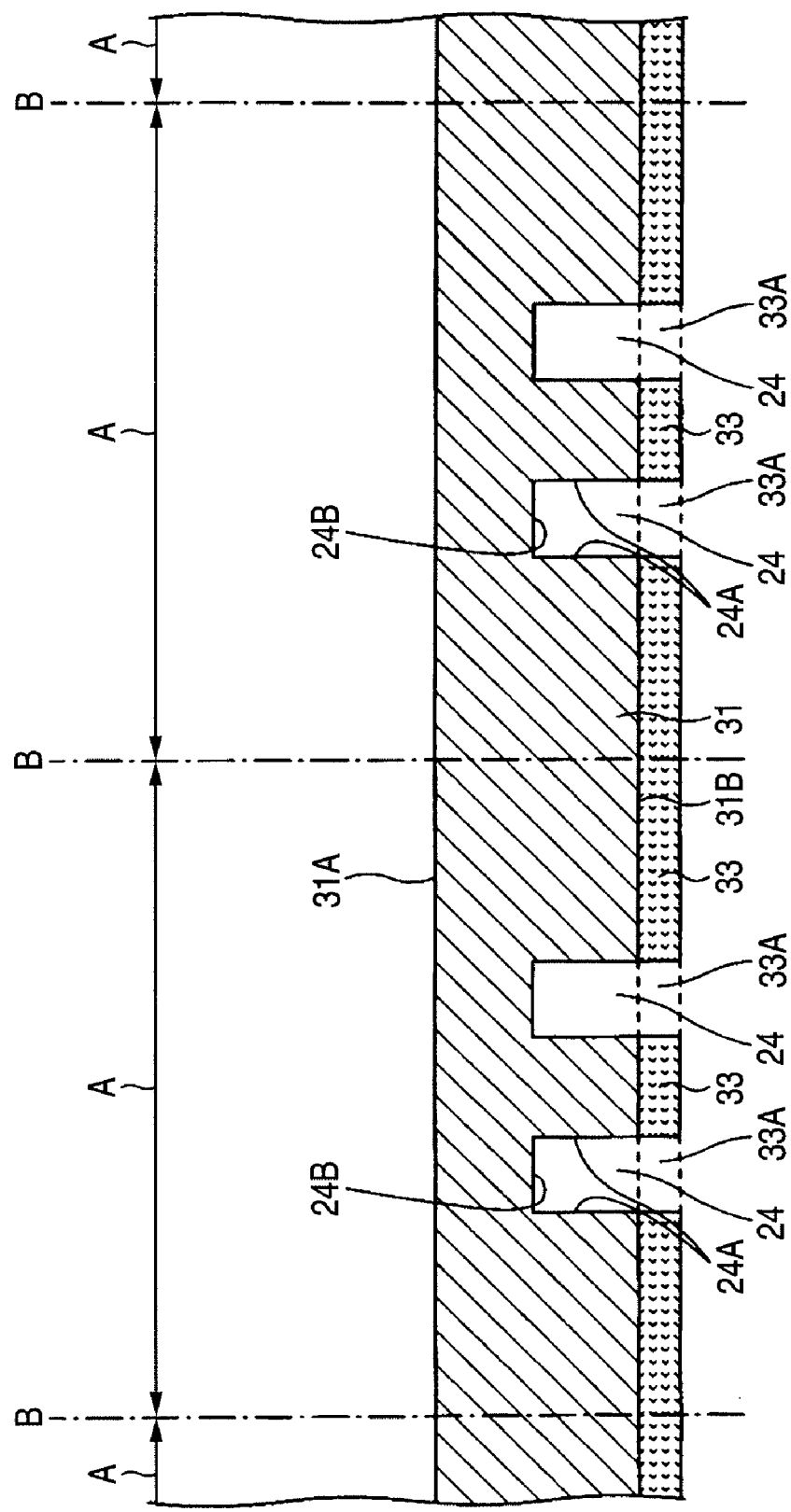
FIG. 16 is a view (#3) showing steps of manufacturing the substrate according to the first embodiment of the present invention.

Then, in steps shown in FIG. 16, the through holes 24 are formed by etching the portions, which are exposed from the openings 33A, of the silicon substrate 31 from the surface 31B (first surface) side of the silicon substrate 31 by applying the anisotropic etching (e.g., dry etching) using the resist film 33 as a mask (through hole forming step).

In this manner, the through holes 24 are formed in the silicon substrate 31 prior to the formation of the cavity 22. Therefore, the side surfaces 22B of the cavity 22 are never etched by the anisotropic etching applied in forming the through holes 24 As a result, such a situation can be prevented that the side surfaces 22B of the cavity 22 are roughened.

In the through hole forming step, preferably the through holes 24 shown in FIG. 16 should be deeper than the through holes 24 described previously and shown in FIG. 13.

In this manner, in the through hole forming step, a depth of the through holes 24 are formed deeper than a depth of the through holes 24 provided to the wiring substrate 10 as the completed device shown in FIG. 13. Therefore, the cavity 22 and the through holes 24 can be connected mutually even in such a situation that a depth $D_1$ of the cavity 22 formed after the formation of the through holes becomes shallower than a desired depth. When a depth of the through holes 24 provided to the wiring substrate 10 shown in FIG. 13 is 200 µm and a depth $D_1$ of the cavity 22 is 200 µm, a depth of the through holes 24 formed in the through hole forming step can be set to 250 µm, for example.

Figure 17:
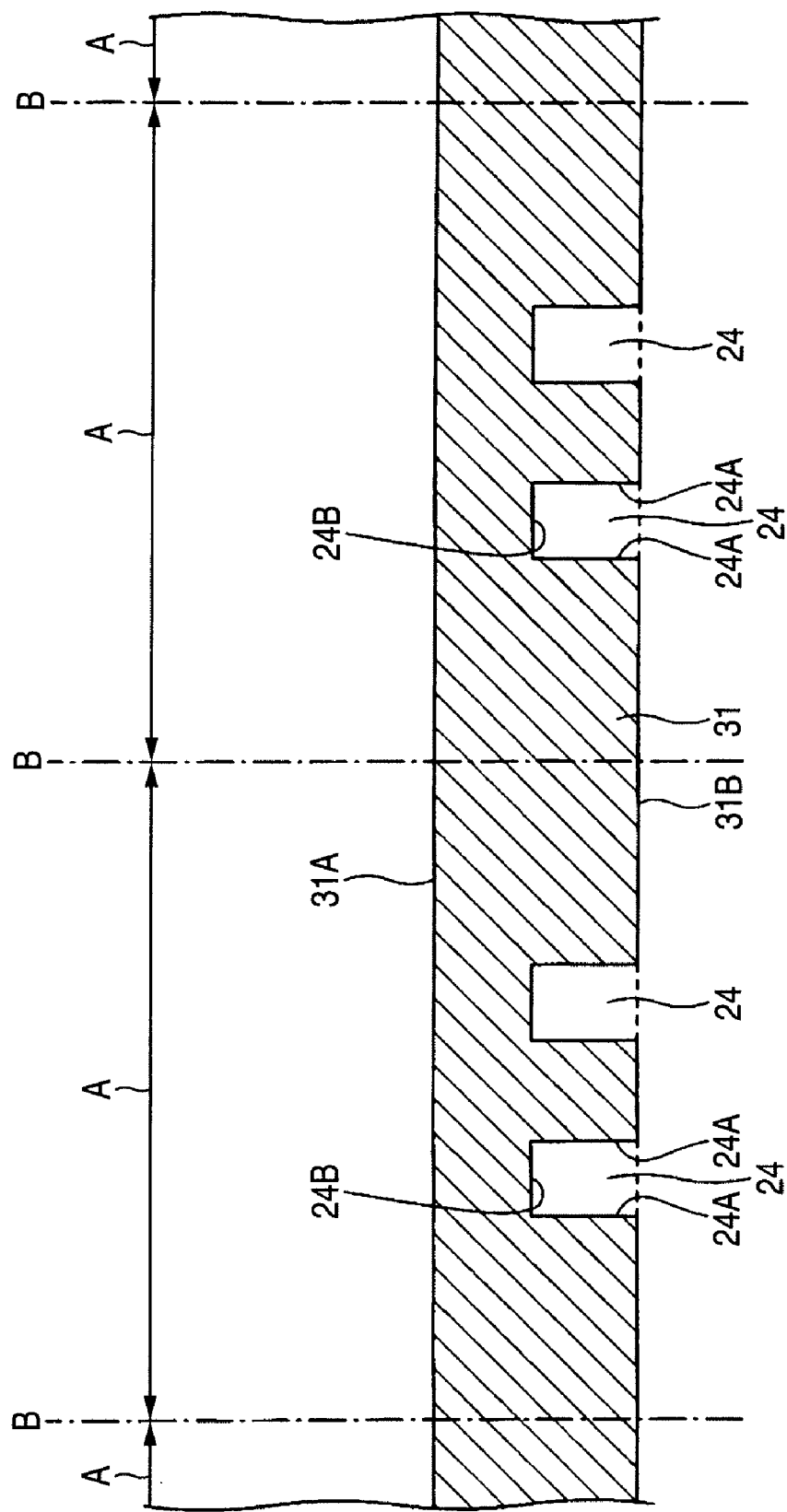
FIG. 17 is a view (#4) showing steps of manufacturing the substrate according to the first embodiment of the present invention.
Figure 18:
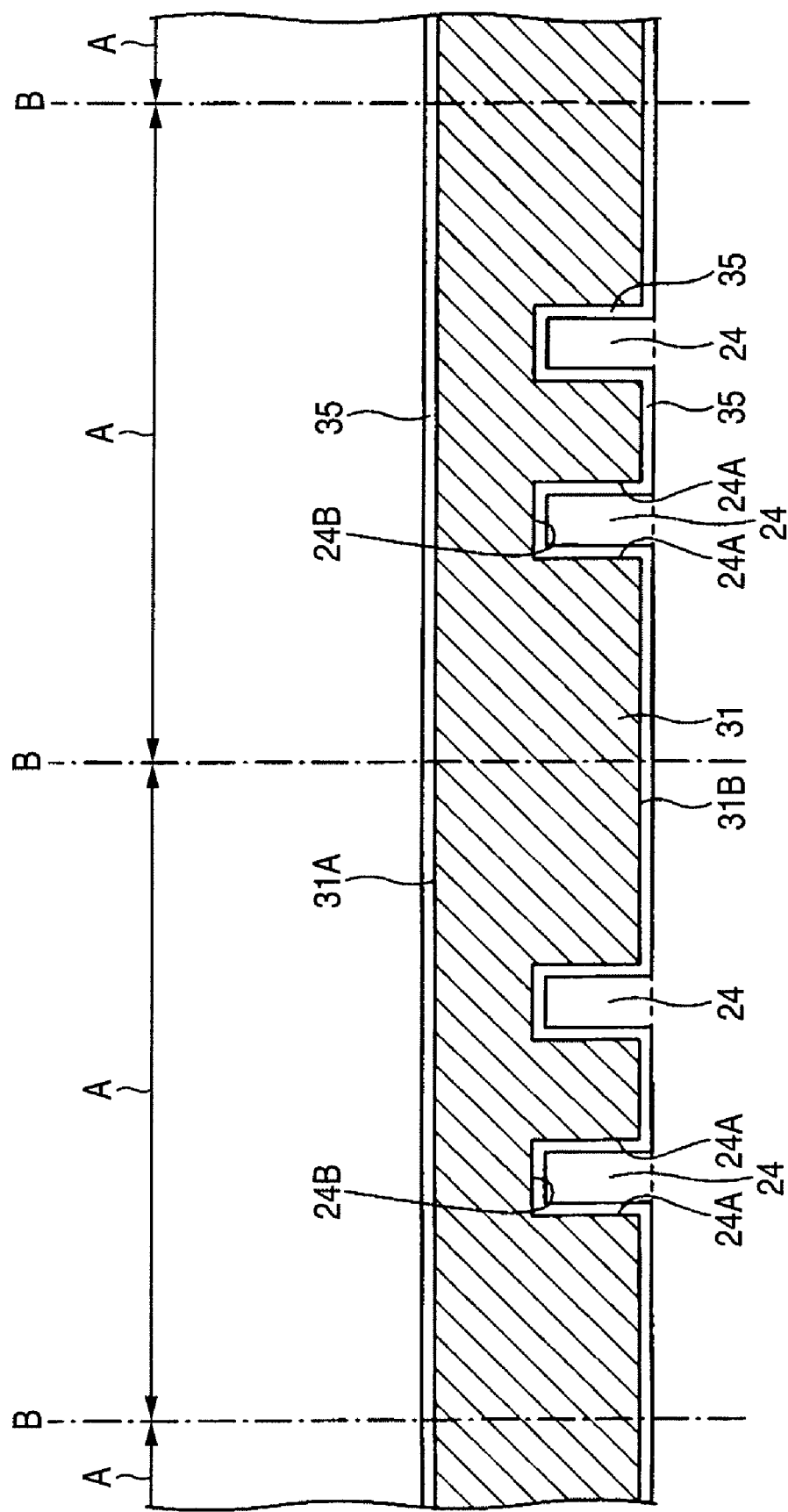
FIG. 18 is a view (#5) showing steps of manufacturing the substrate according to the first embodiment of the present invention.

Then, in steps shown in FIG. 17, the resist film 33 shown in FIG. 16 is removed. Then, in steps shown in FIG. 18, an insulating film 35 (first insulating film) is formed to cover the surface 31A (second surface) of the silicon substrate 31, the surface 31B (first surface) of the silicon substrate 31, and the surface of the silicon substrate 31 exposed from the through holes 24 (side surfaces 24A and bottom surfaces 24B of the through holes 24) (first insulating film forming step). Accordingly, the insulating film 35 is formed to cover the side surfaces 24A and the bottom surfaces 24B of the through holes 24. As the insulating film 35, for example, oxide film, thermal oxide film, or nitride film (e.g., SiN film) formed by the CVD method can be used. When the oxide film or the thermal oxide film is used as the insulating film 35, a thickness of the insulating film 35 can be set to 0.5 µm to 1.5 µm, for example.

Figure 19:
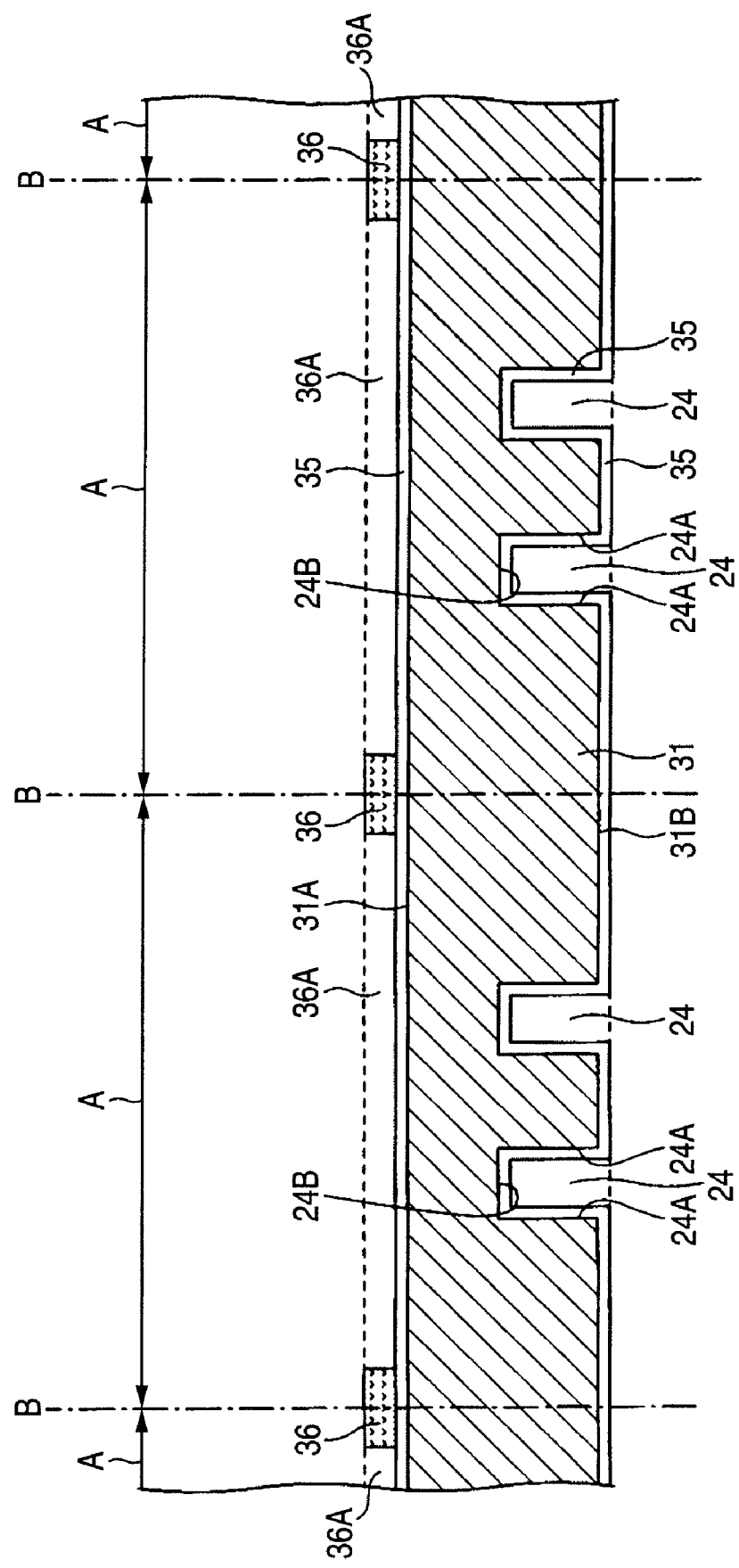
FIG. 19 is a view (#6) showing steps of manufacturing the substrate according to the first embodiment of the present invention.

Then, in steps shown in FIG. 19, a resist film 36 having openings 36A is formed on the insulating film 35 provided on the surface 31A of the silicon substrate 31. At this time, the openings 36A are formed to expose the insulating film 35 in portions corresponding to the forming areas of the cavity 22.

Figure 20:
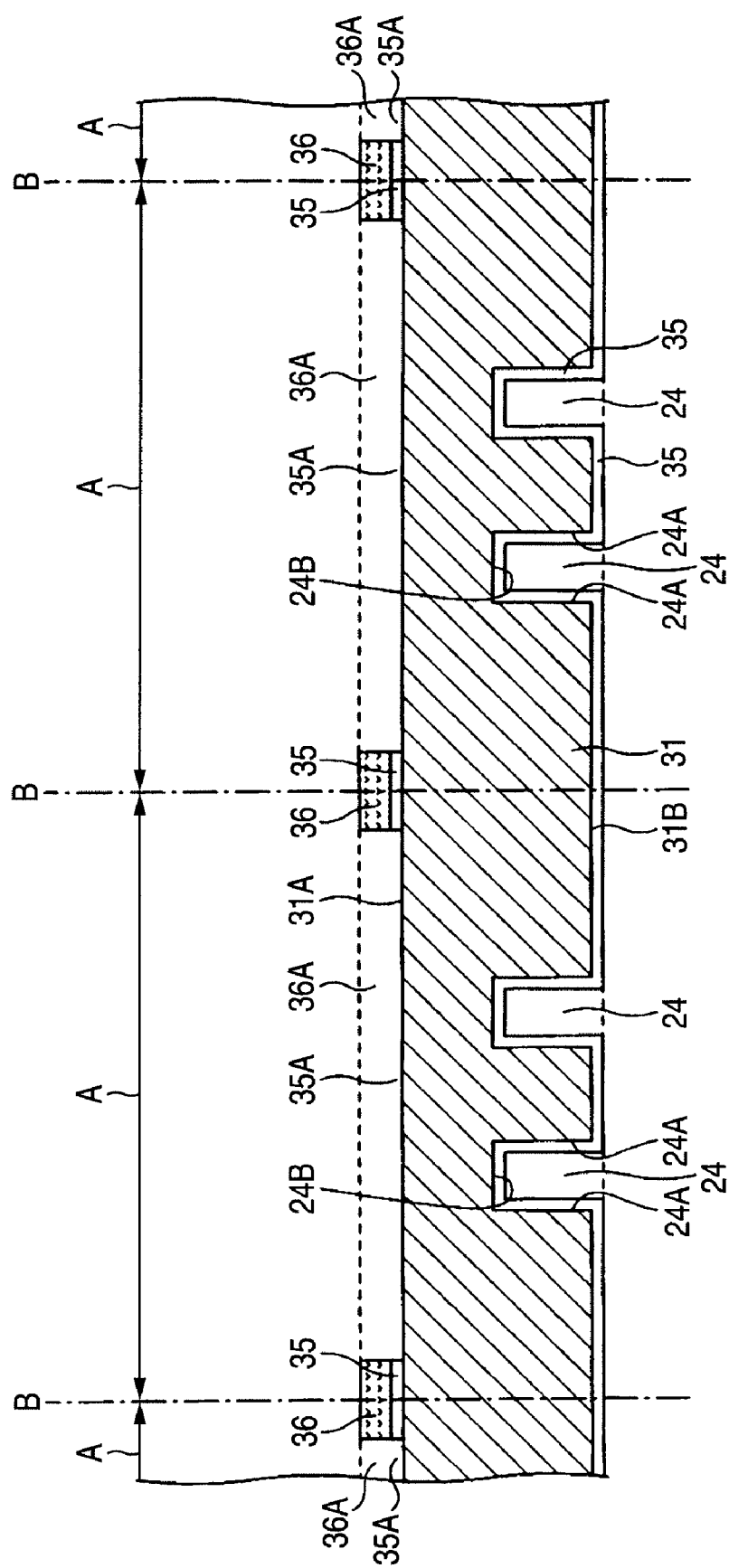
FIG. 20 is a view (#7) showing steps of manufacturing the substrate according to the first embodiment of the present invention.

Then, in steps shown in FIG. 20, openings 35A are formed in portions, which correspond to the forming areas of the cavity 22, of the insulating film 35 provided on the surface 31A of the silicon substrate 31 (opening forming step). The insulating film 35 in which the openings 35A are formed serves as a mask upon forming the cavities 22 by etching the silicon substrate 31.

Figure 21:
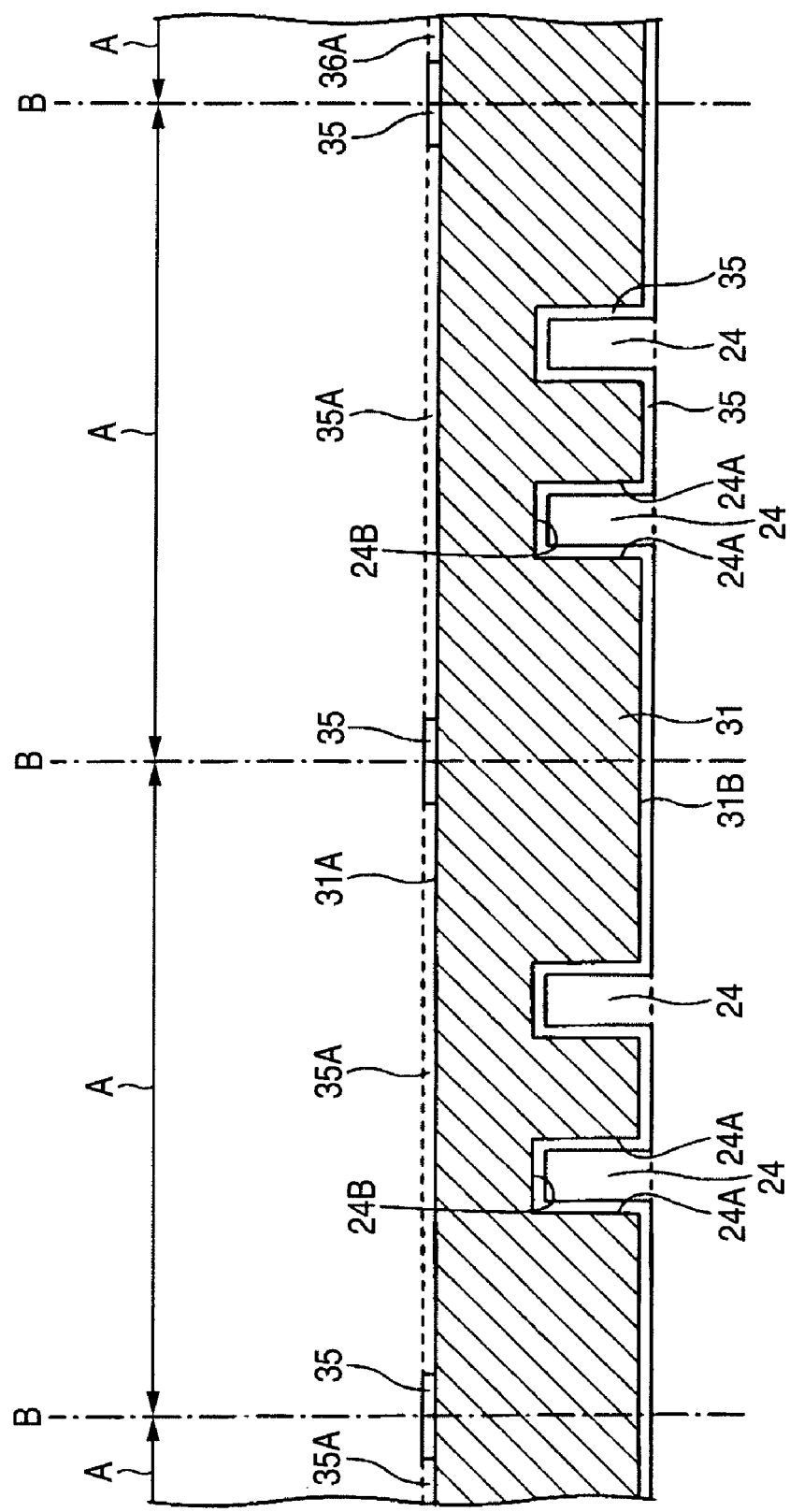
FIG. 21 is a view (#8) showing steps of manufacturing the substrate according to the first embodiment of the present invention.

Then, in steps shown in FIG. 21, the resist film 36 shown in FIG. 20 is removed. Then, in steps shown in FIG. 22, the cavities 22 each having a sectional shape whose width is widened gradually as a distance from the through hole 24 is increased are formed by etching the silicon substrate 31 from the surface 31A (second surface) side of the silicon substrate 31 shown in FIG. 21 by applying the wet etching using the insulating film 35 having the openings 35A as a mask (cavity forming step).

At this time, the cavity 22 is formed such that the insulating film 35 provided on the bottom surfaces 24B of the through holes 24, or the insulating film 35 provided on the bottom surfaces 24B of the through holes 24 and the insulating film 35 provided on the side surfaces 24A of the through holes 24 positioned near the bottom surfaces 24B are exposed by the cavity 22. In this case, the insulating film 35 provided on the bottom surfaces 24B of the through holes 24, or the insulating film 35 provided on the bottom surfaces 24B of the through holes 24 and the insulating film 35 provided on the side surfaces 24A of the through holes 24 positioned near the bottom surfaces 24B is dipped in an etchant. In this event, since the insulating film 35 provided to cover the side surfaces 24A and the bottom surfaces 24B of the through holes 24 acts as an etching stopper, it can be prevented that portions of the silicon substrate 31, which correspond to the side surfaces of the through holes 24 shown in FIG. 13, are etched. As a result, the through holes 24 shaped in good profile can be formed.

In the cavity forming step, as the etchant used in applying the wet etching to the silicon substrate 31, an etchant that is hard to etch the insulating film 35 should be employed. For example, TMAH (tetramethylammonium hydroxide) aqueous solution (e.g., concentration is 25%) can be employed as the concrete etchant.

A depth $D_1$ of the cavity 22 can be set to 200 µm, for example. In this case, a thickness $M_1$ of the portion of the silicon substrate 31 between the bottom surface 22A of the cavity 22 and the surface 31B of the silicon substrate 31 can be set to 200 µm, for example. Also, an angle $\theta_1$ between the side surface 22B and the bottom surface 22A of the cavity 22 can be set to 125 degree to 135 degree, for example.

Figure 22:
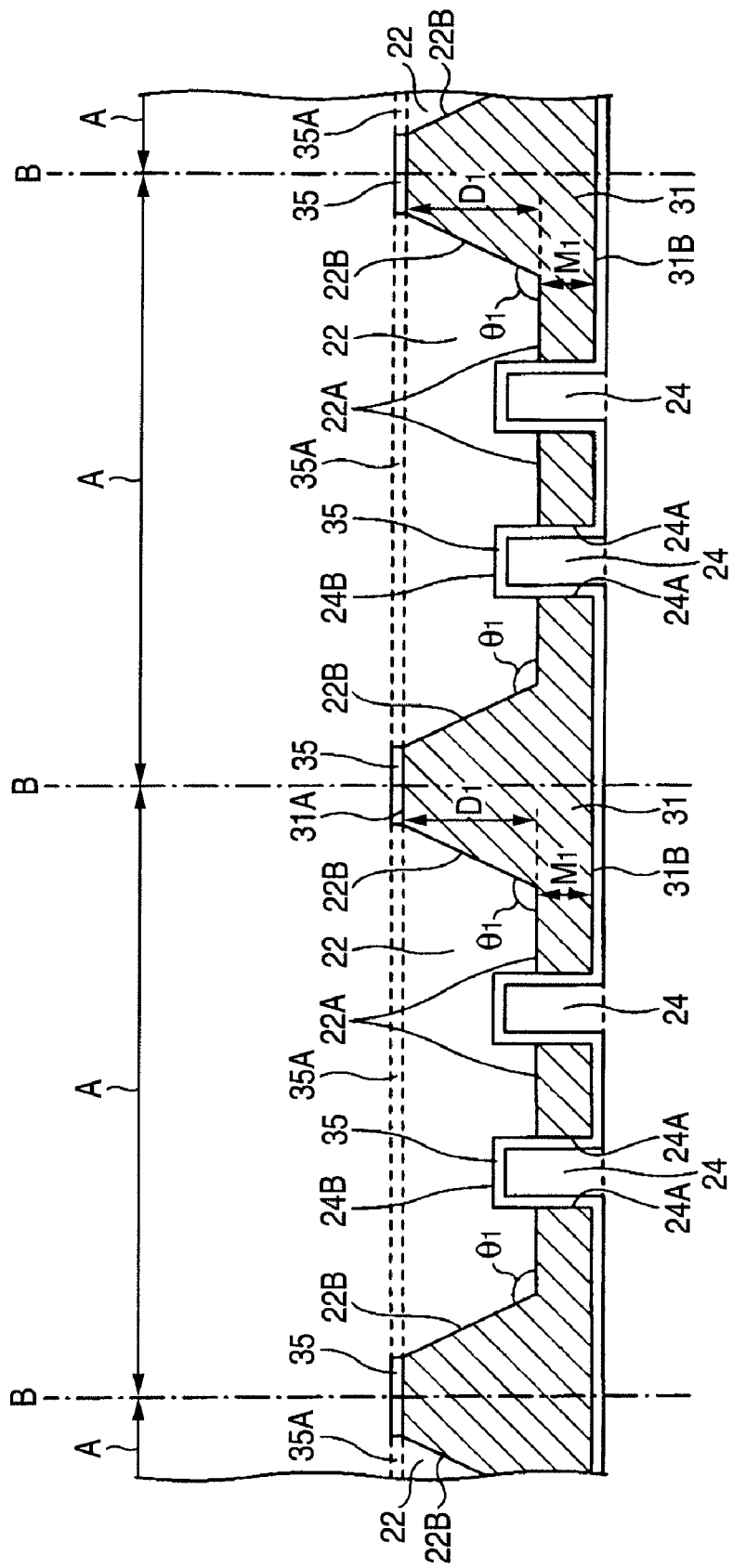
FIG. 22 is a view (#9) showing steps of manufacturing the substrate according to the first embodiment of the present invention.
Figure 23:
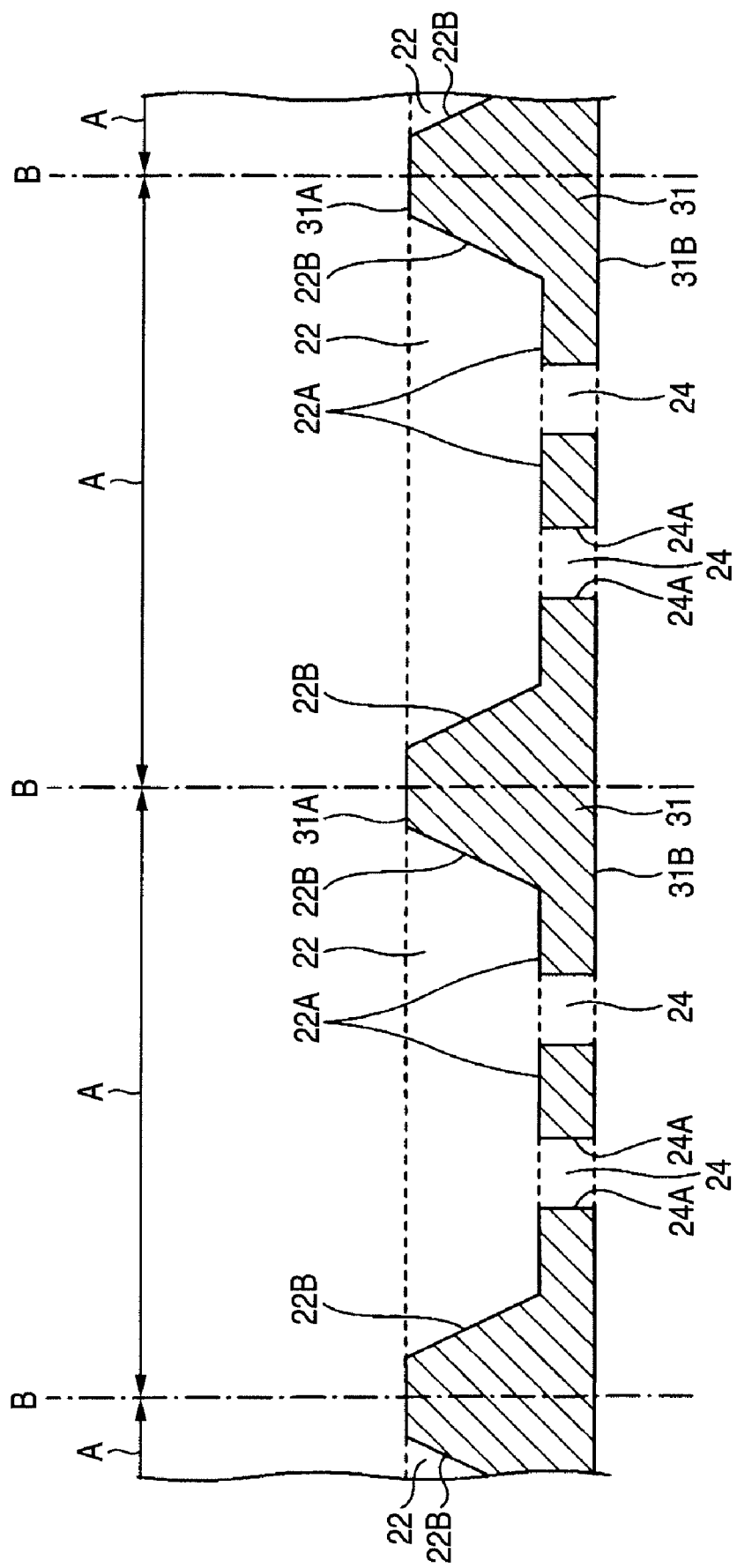
FIG. 23 is a view (#10) showing steps of manufacturing the substrate according to the first embodiment of the present invention.

Then, in steps shown in FIG. 23, the insulating film 35 shown in FIG. 22 is removed (first insulating film removing step). Accordingly, the cavity 22 and the through holes 24 are connected mutually. The insulating film 35 can be removed by using a 0.5% hydrofluoric acid, a buffered hydrofluoric acid, or the like.

Figure 24:
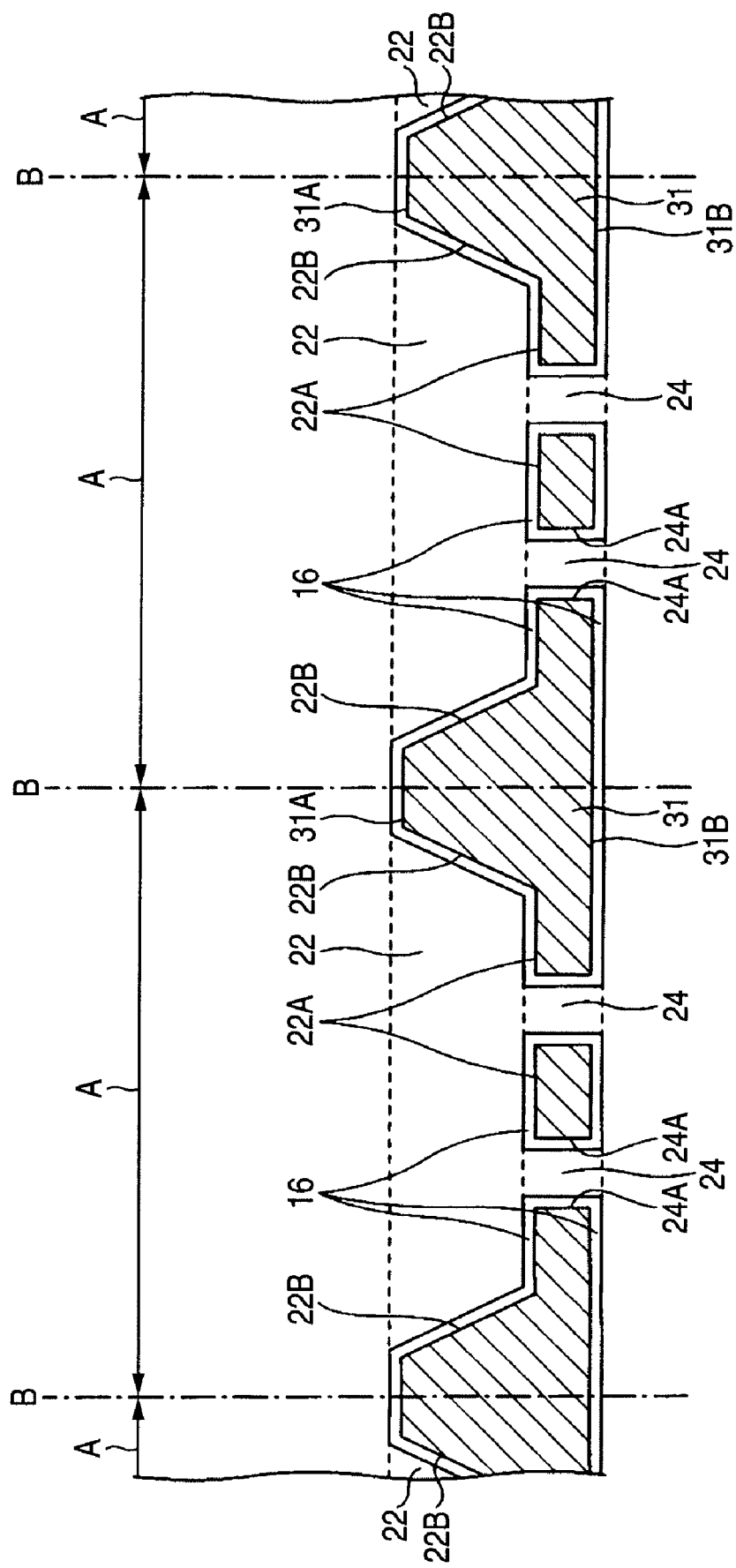
FIG. 24 is a view (#11) showing steps of manufacturing the substrate according to the first embodiment of the present invention.

Then, in steps shown in FIG. 24, the insulating film 16 (second insulating film) is formed to cover the surfaces 31A, 31B of the silicon substrate 31, the bottom surface 22A and the side surfaces 22B of the cavity 22, and the surfaces of the portions of the silicon substrate 31 corresponding to the side surfaces 24A of the through holes 24 (second insulating film forming step). As the insulating film 16, for example, oxide film, nitride film (e.g., SiN film), or thermal oxide film formed by the CVD method can be used. When the oxide film or the thermal oxide film is used as the insulating film 16, a thickness of the insulating film 16 can be set to 0.5 µm to 1.5 µm, for example. The insulating film 16 is provided to insulate the silicon substrate 15 from the through silicon vias 18 and the wirings 19 (see FIG. 13). Therefore, the insulating film 16 may be formed to cover at least the surfaces of the portions of the silicon substrate 31 corresponding to the side surfaces 24A of the through holes 24 and the surface 31B of the silicon substrate 31.

Figure 25:
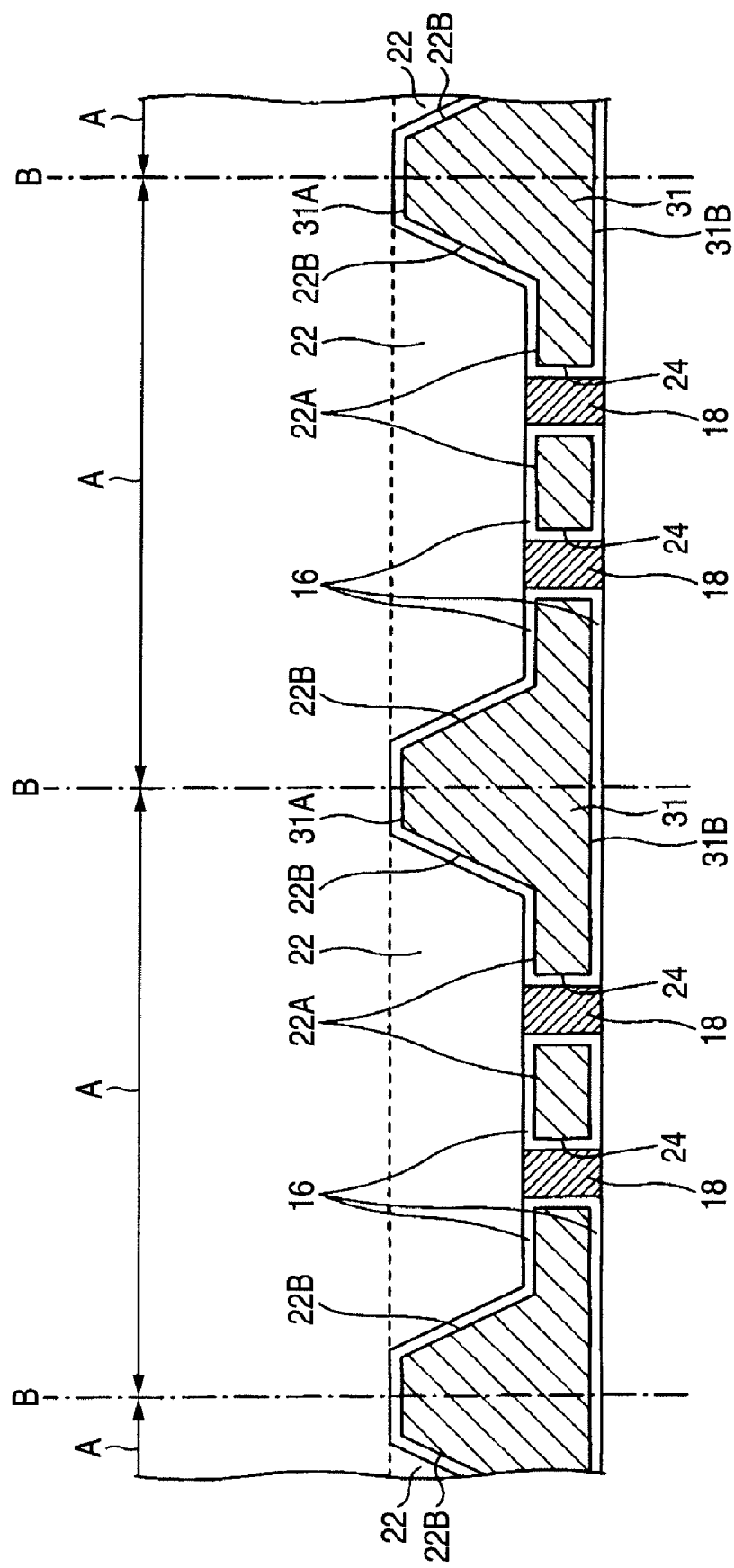
FIG. 25 is a view (#12) showing steps of manufacturing the substrate according to the first embodiment of the present invention.

Then, in steps shown in FIG. 25, the through silicon via 18 is formed in the through holes 24, on which the insulating film 16 is formed, respectively (through silicon via forming step). Concretely, for example, a metallic foil (e.g., a Cu foil) is pasted onto the insulating film 16 provided on the surface 31B of the silicon substrate 31, and then a plating film (e.g., a Cu plating film) is deposited/grown by the electroplating using this metallic foil as a power feeding layer to fill the through holes 24. Thus, the through silicon vias 18 are formed. In this case, the metallic foil can be used as a base material of the wirings 19 in steps described later and shown in FIG. 26.

Figure 26:
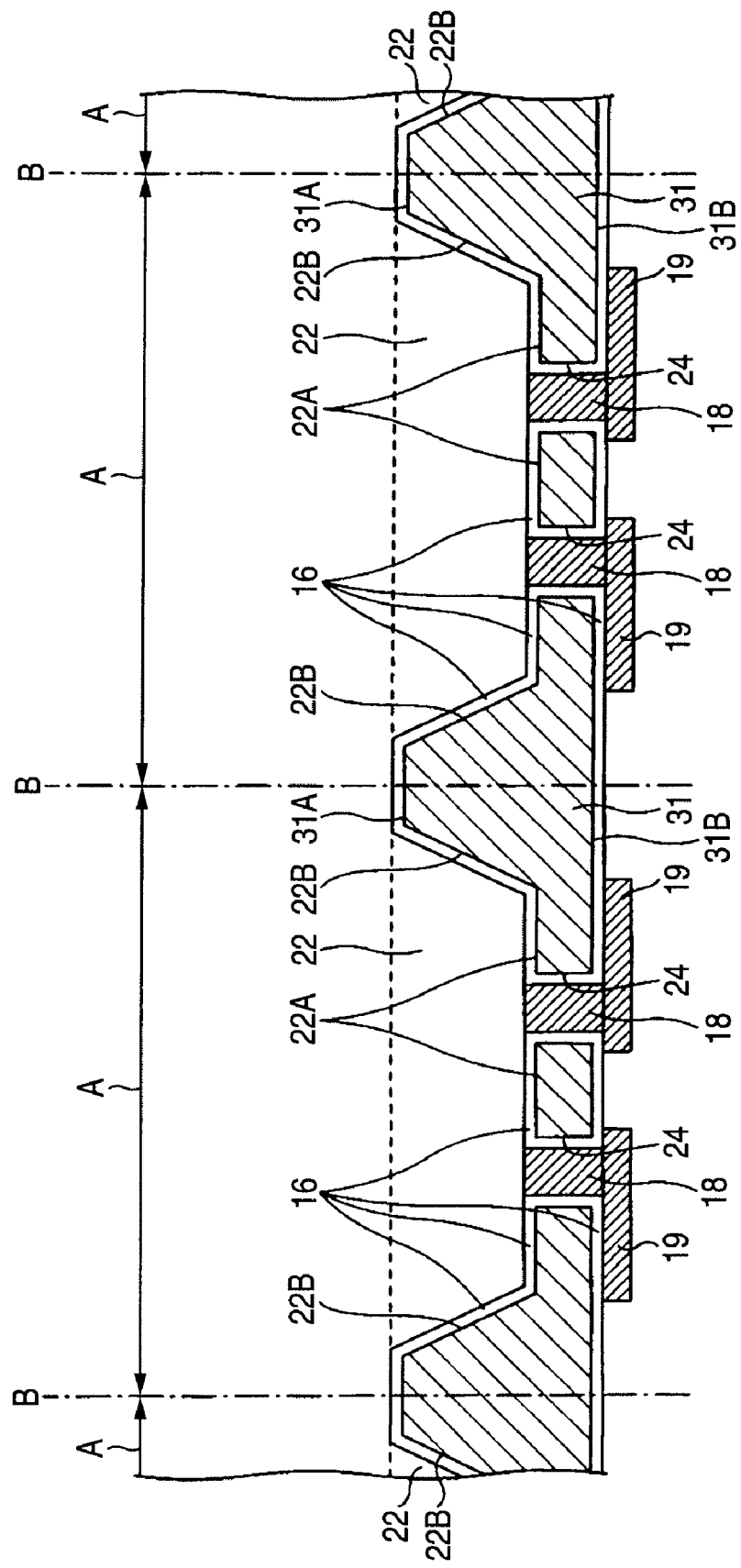
FIG. 26 is a view (#13) showing steps of manufacturing the substrate according to the first embodiment of the present invention.

Then, in steps shown in FIG. 26, the wirings 19 are formed by the well-known approach. Concretely, the wirings 19 are formed by patterning the metallic foil (Cu foil) described in steps shown in FIG. 25 (the subtractive process), for example (wiring forming step). Accordingly, a structure corresponding to a plurality of substrates 11 is formed on the silicon substrate 31. A thickness of the wirings 19 can be set to 5 µm, for example. In this case, the wirings 19 may be formed by the semi-additive process, for example.

Figure 27:
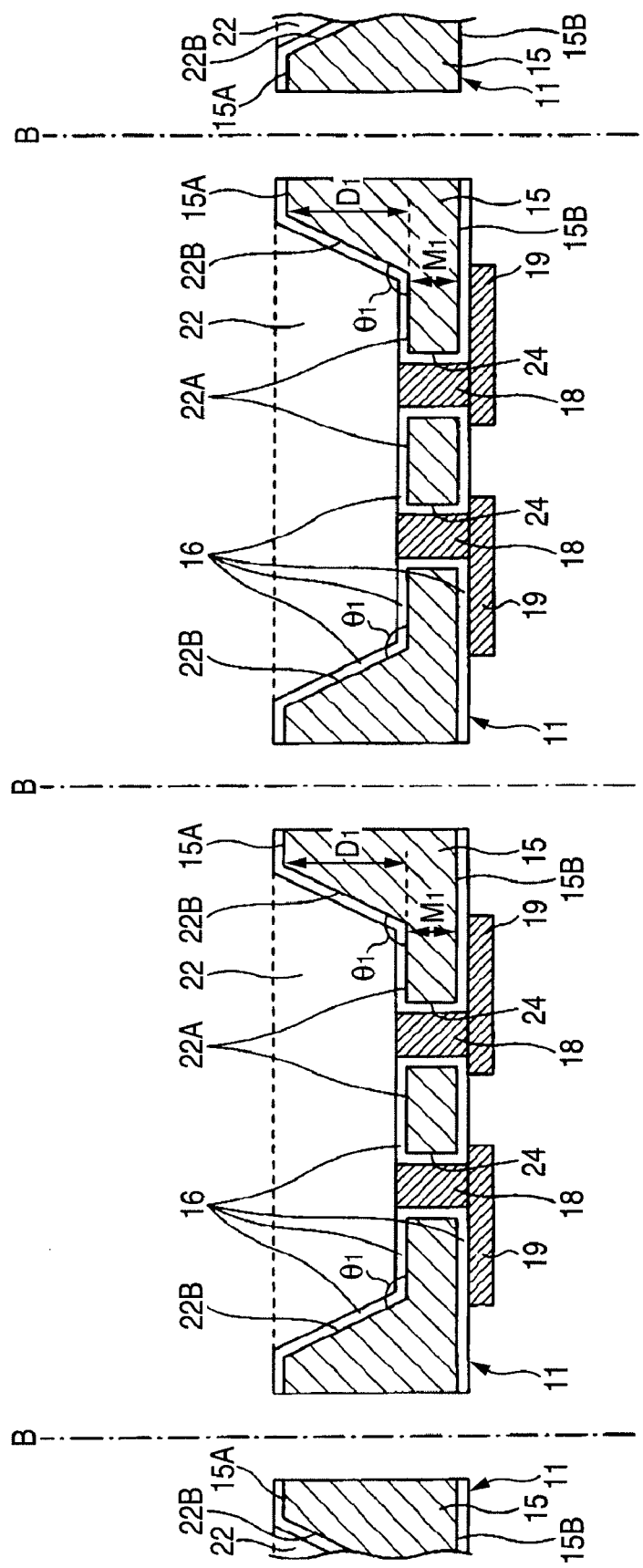
FIG. 27 is a view (#14) showing steps of manufacturing the substrate according to the first embodiment of the present invention.

Then, in steps shown in FIG. 27, the semiconductor substrate 31 is cut along the cutting position B. Accordingly, a plurality of substrates 11 are manufactured.

According to the method of manufacturing the substrate of the present embodiment, the through holes 24 are formed by applying the anisotropic etching to the silicon substrate 31 prior to the formation of the cavity 22. Therefore, the side surfaces 22B of the cavity 22 are never etched by the anisotropic etching applied in forming the through holes 24. As a result, such a situation can be prevented that the side surfaces 22B of the cavity 22 are roughened.

Also, the insulating film 35 is formed on the surfaces of the portions, which are exposed from the through holes 24, of the silicon substrate 31 (the side surfaces 24A and the bottom surfaces of the through holes 24) after the through hole forming step. Then, the cavity 22 is formed by etching the silicon substrate 31 using the insulating film 35, which has the openings 35A and is provided on the surface 31A of the silicon substrate 31, as a mask such that at least the portions of the insulating film 35 provided on the bottom surfaces 24B of the through holes 24 are exposed. Therefore, the portions of the insulating film 35, which are formed on the bottom surfaces 24B and the side surfaces 24A of the through holes 24, function as an etching stopper. As a result, the portions of the silicon substrate 31 corresponding to the side surfaces of the through holes 24 shown in FIG. 13 are never etched, and thus the through holes 24 shaped in good profile can be formed.

Figure 28:
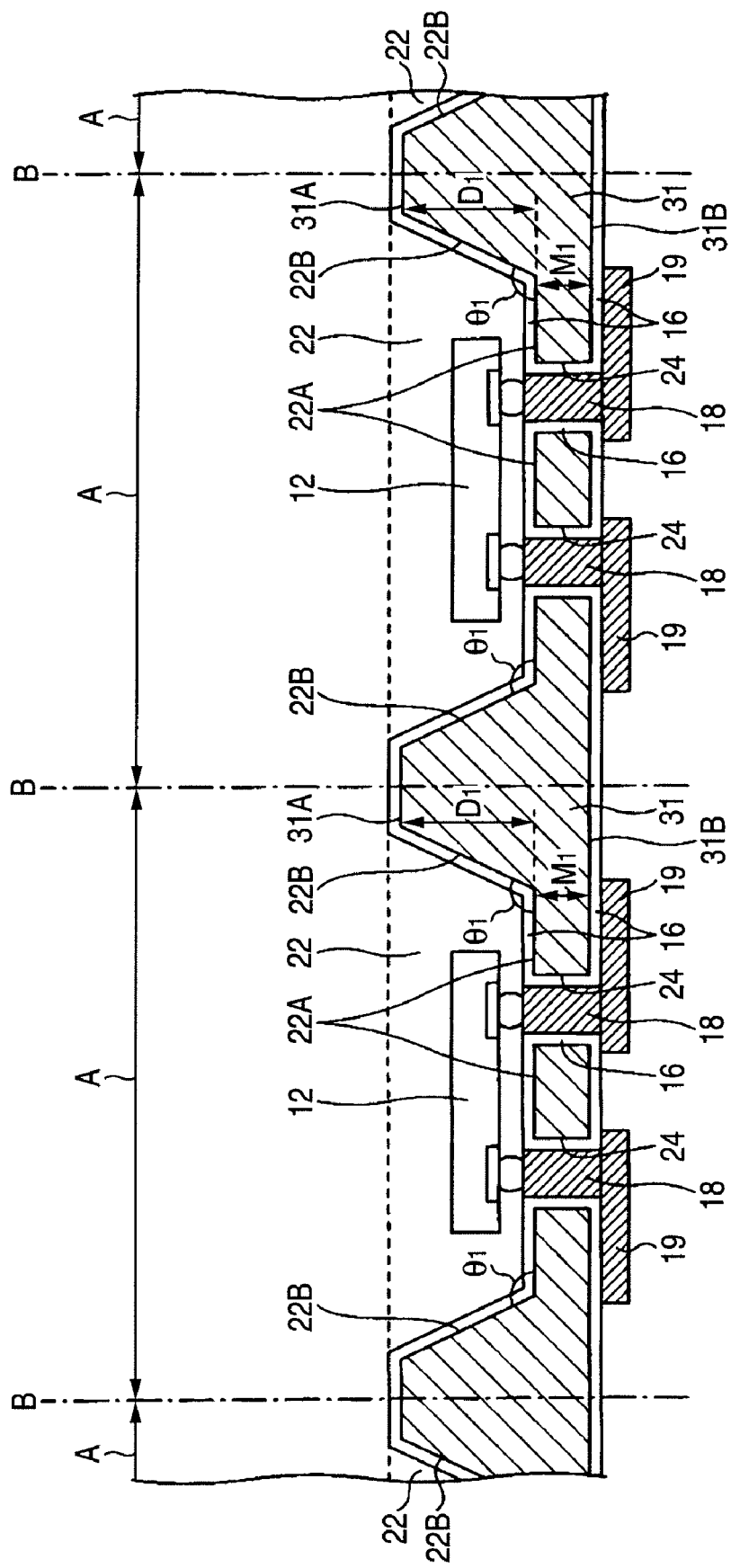
FIG. 28 is a view (#1) showing steps of manufacturing a light emitting device having the substrate according to the first embodiment of the present invention.
Figure 29:
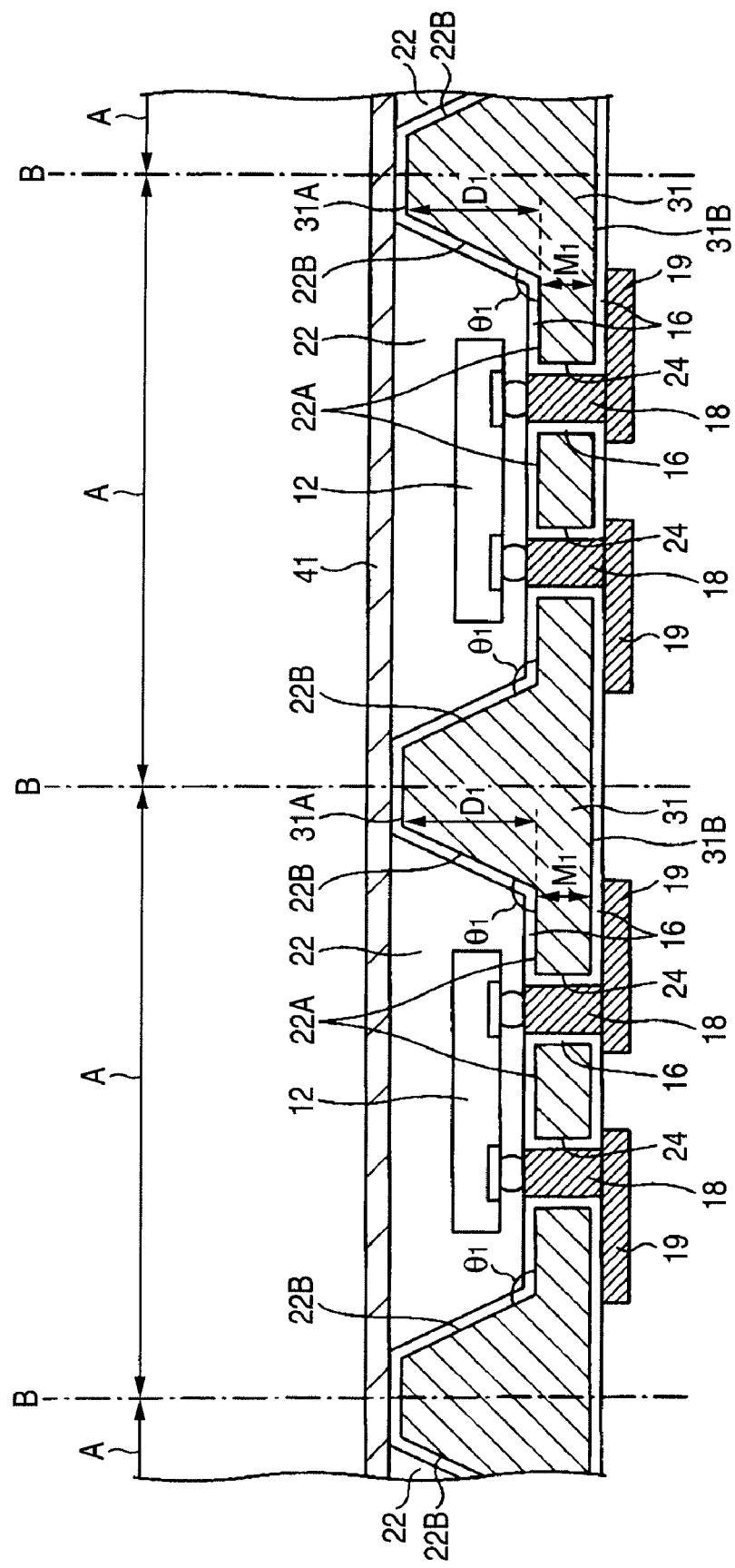
FIG. 29 is a view (#2) showing steps of manufacturing the light emitting device having the substrate according to the first embodiment of the present invention.
Figure 30:
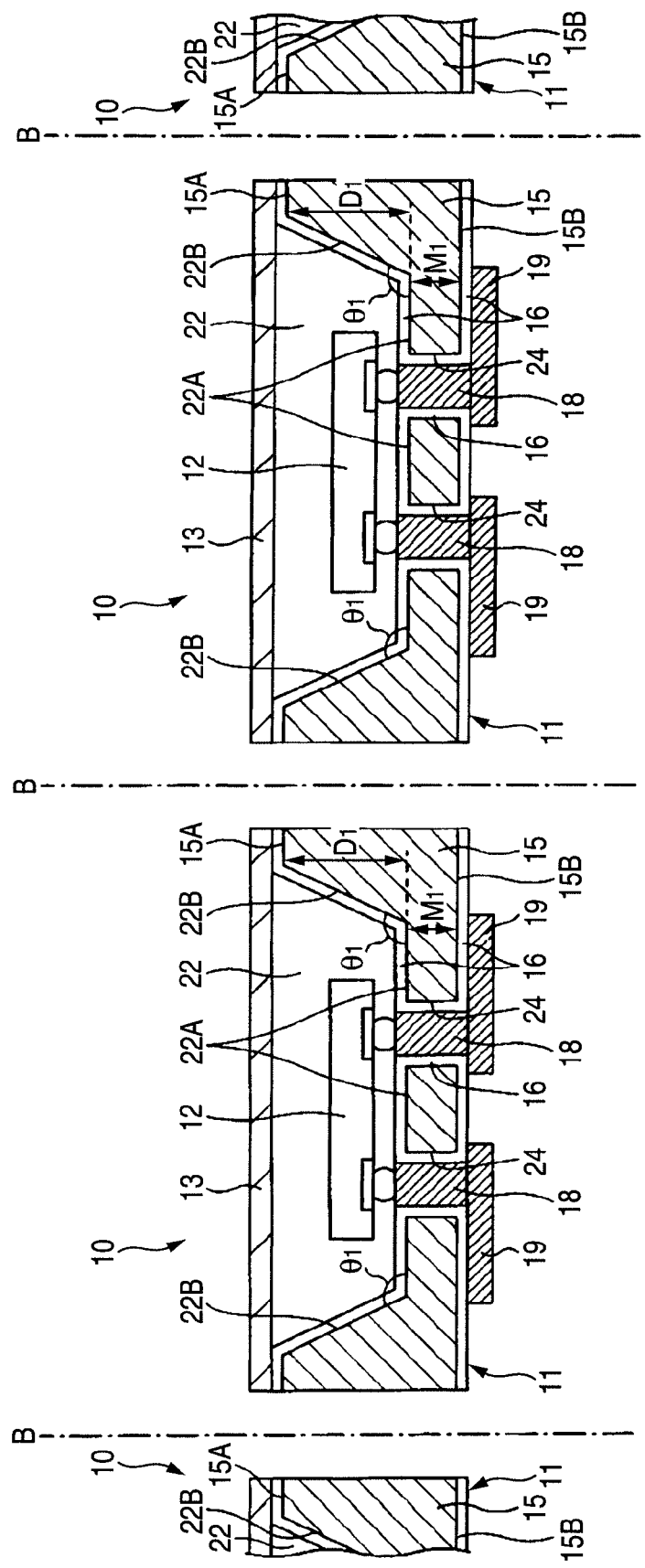
FIG. 30 is a view (#3) showing steps of manufacturing the light emitting device having the substrate according to the first embodiment of the present invention.

FIG. 28 to FIG. 30 are views showing steps of manufacturing the light emitting device having the substrate according to the first embodiment of the present invention. In FIG. 28 to FIG. 30, the same reference symbols are affixed to the same constituent portions as those of the light emitting device 10 described previously.

Then, the method of manufacturing the light emitting device 10 having the substrate 11 according to the first embodiment will be described with reference to FIG. 28 to FIG. 30 hereunder. At first, the structure described previously and shown in FIG. 26 is prepared. Then, in steps shown in FIG. 28, the light emitting element 12 is connected to the through silicon vias 18 of the structure shown in FIG. 26. As a result, the light emitting element 12 is housed in the cavity 22, and the through silicon vias 18 and the light emitting element 12 are connected electrically mutually.

Then, in steps shown in FIG. 29, a glass substrate 41 is adhered to the upper portion of the structure shown in FIG. 28 to cover upper ends of a plurality of cavities 22. Accordingly, the cavities 22 in which the light emitting element 12 is housed respectively are sealed in an airtight manner, and also the structure corresponding to a plurality of light emitting devices 10 is formed. The glass substrate 41 provides the glass substrates 13 described previously and shown in FIG. 13 when this glass substrate is cut (into individual pieces) in steps shown in FIG. 30 described later.

Then in steps shown in FIG. 30, the structure shown in FIG. 29 is cut along the cutting position B. Accordingly, the plurality of light emitting devices 10 are manufactured.

As described above, when the plurality of light emitting devices 10 are formed, the glass substrate 41 is adhered to the structure shown in FIG. 28, and then the silicon substrate 31 is cut.

Second Embodiment

Figure 31:
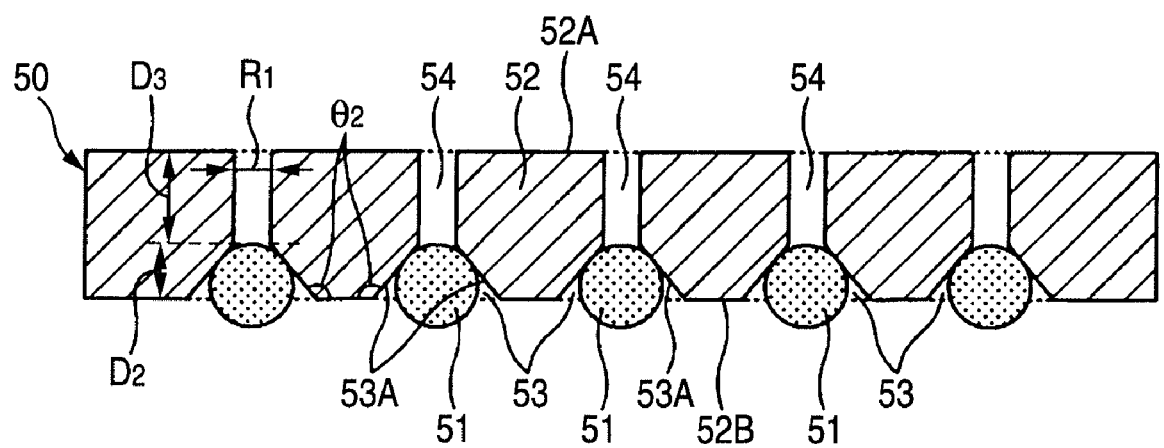
FIG. 31 is a sectional view of a substrate according to a second embodiment of the present invention.

FIG. 31 is a sectional view of a substrate according to a second embodiment of the present invention. In FIG. 31, such a state is schematically shown that a substrate 50 sucks conductive balls 51. In the present embodiment, following explanation will be given by taking the substrate 50 for mounting the conductive balls 5 on the pads (the pads coated with the adhesive for securing the conductive balls) provided to the wiring substrate (not shown), as an example.

By reference to FIG. 31, the substrate 50 is the conductive ball mounting substrate, and is constructed such that cavities 53 and through holes 54 are formed in a silicon substrate 52.

The cavities 53 are formed on the surface 52B (first surface) side of the silicon substrate 52. The cavity 53 is the concave portion to restrict the position of the sucked conductive ball 51. The cavities 53 are connected to the through holes 54 formed over the cavities 53 respectively. An upper end of the cavity 53 (the portion of the cavity 53 connected to the through hole 54) is formed like a circular shape. A diameter of the upper end of the cavity 53 is set substantially equal to a diameter $R_1$ of the through hole 54. When a diameter of the conductive ball 51 is set to 100 µm, a depth $D_2$ of the cavity 53 can be set to 70 µm, for example.

The cavity 53 has a sectional shape whose width is widened gradually as a distance from the through hole 54 is increased. A side surface 53A of the cavity 53 is an inclined surface that comes into contact with the conductive ball 51 when the substrate 50 sucks the conductive ball 51. An angle $\theta_2$ between the side surface 53A of the cavity 53 and the surface 52B of the silicon substrate 52 can be set to 125 degree, for example.

The through hole 54 is formed to pass through the portions of the silicon substrate 52 corresponding to the bottom surfaces of the cavities 53 (in other words, the portions of the silicon substrate 52 positioned between the cavities 53 and a surface 52A (second surface) of the silicon substrate 52). When a diameter of the conductive ball 51 is set to 100 µm, a diameter $R_1$ of the through hole 54 can be set to 20 µm, for example. Also, a depth $D_3$ of the through hole 54 can be set to 100 µm, for example.

The through holes 54 are connected to an exhaust equipment (not shown). The exhaust equipment (not shown) exhausts an air in the cavities 53 via the through holes 54 to suck the conductive balls 51 onto the cavities 53.

The substrate 50 constructed as above can be manufactured by performing the similar processes to the steps described in the first embodiment and shown in FIG. 14 to FIG. 23. The substrate 50 manufactured by such approaches can achieve the similar advantages to those of the method of manufacturing the substrate 11 in the first embodiment. Accordingly, it can be prevented that a breakage of the conductive ball sucking substrate 50 or a defective suction of the conductive balls 51 is caused.

In this case, the insulating film 16 (see FIG. 13) described in the first embodiment may be provided on the surface of the silicon substrate 52 in which the cavities 53 and the through holes 54 are formed (including the surfaces of the portions of the silicon substrate corresponding to the side surfaces of the cavities 53 and the side surfaces of the through holes 54). In this manner, a surface state of the substrate 50 (e.g., wettability) can be changed by providing the insulating film 16 to the substrate 50.

For example, the present invention is applicable to the substrate having the silicon substrate in which the cavity and the through holes connected to the cavity are formed.

While the present invention has been shown and described with reference to certain exemplary embodiments thereof, it will be understood by those skilled in the art that various changes in form and details may be made therein without departing from the spirit and scope of the invention as defined by the appended claims. It is aimed, therefore, to cover in the appended claim all such changes and modifications as fall within the true spirit and scope of the present invention.

What is claimed is:

1. A method of manufacturing a substrate, the method comprising the successive steps of:
 (a) forming through holes by applying an anisotropic etching to a silicon substrate from a first surface of the silicon substrate;
 (b) forming a first insulating film to cover the first surface of the silicon substrate, surfaces of the silicon substrate exposed from the through holes, and a second surface of the silicon substrate opposite to the first surface;
 (c) forming an opening in a portion of the first insulating film provided on the second surface, the portion of the first insulating film corresponding to an area in which the through holes are formed;
 (d) etching the silicon substrate using the first insulating film provided on the second surface as a mask such that at least the first insulating film provided on bottom surfaces of the through holes is exposed, thereby forming a cavity in the silicon substrate, and forming the cavity such that a width of a cross-sectional shape of the cavity is widened gradually as a distance from the through holes is increased; and (e) removing the first insulating film.

2. A method of manufacturing a substrate, the method comprising the successive steps of:

(a) forming through holes by applying an anisotropic etching to a silicon substrate from a first surface of the silicon substrate;

(b) forming a first insulating film to cover the first surface of the silicon substrate, surfaces of the silicon substrate exposed from the through holes, and a second surface of the silicon substrate opposite to the first surface;

(c) forming an opening in a portion of the first insulating film provided on the second surface the portion of the first insulating film corresponding to an area in which the through holes are formed;

(d) etching the silicon substrate using the first insulating film provided on the second surface as a mask such that at least the first insulating film provided on bottom surfaces of the through holes is exposed thereby forming a cavity in the silicon substrate;

(e) removing the first insulating film;

(f) forming a second insulating film to cover at least the second surface of the silicon substrate and surfaces of the silicon substrate corresponding to side surfaces of the through holes; and (g) forming a through silicon via in the through holes on which the second insulating film is formed.

3. The method according to claim 2, further comprising:

(h) forming wirings connected to one end portions of the through holes, on the first surface of the silicon substrate.

4. A method of manufacturing a light emitting device, the method comprising the successive steps of:

(a) forming through holes by applying an anisotropic etching to a silicon substrate from a first surface of the silicon substrate;

(b) forming a first insulating film to cover the first surface of the silicon substrate, surfaces of the silicon substrate exposed from the through holes, and a second surface of the silicon substrate opposite to the first surface;

(c) forming an opening in a portion of the first insulating film provided on the second surface, the portion of the first insulating film corresponding to an area in which the through holes are formed;

(d) etching the silicon substrate using the first insulating film provided on the second surface as a mask such that at least the first insulating film provided on bottom surfaces of the through holes is exposed, thereby forming a cavity in the silicon substrate;

(e) removing the first insulating film;

(f) forming a second insulating film to cover at least the second surface of the silicon substrate and surfaces of the silicon substrate corresponding to side surfaces of the through holes;

(g) forming a through silicon via in the through holes on which the second insulating film is formed;

(h) forming wirings connected to one end portions of the through holes, on the first surface of the silicon substrate;

(i) housing a light emitting element in the cavity such that the light emitting element is electrically connected to the other portions of the through holes; and (j) disposing a glass substrate on an upper end portion of the cavity to cover the cavity.

5. A method of manufacturing a conductive ball mounting substrate, the method comprising the successive steps of:

(a) forming a plurality of through holes by applying an anisotropic etching to a silicon substrate from a first surface of the silicon substrate;

(b) forming a first insulating film to cover the first surface of the silicon substrate, surfaces of the silicon substrate exposed from the through holes, and a second surface of the silicon substrate opposite to the first surface;

(c) forming a plurality of openings in portions of the first insulating film provided on the second surface, the portions of the first insulating film corresponding to areas in which the through holes are formed;

(d) etching the silicon substrate using the first insulating film provided on the second surface as a mask such that at least the first insulating film provided on bottom surfaces of the through holes is exposed, thereby forming a plurality of cavities in the silicon substrate, and forming the cavities such that a width of a cross-sectional shape of each cavity is widened gradually as a distance from the through holes is increased; and (e) removing the first insulating film.

* * * * *